(12) United States Patent
Kim et al.

(10) Patent No.: US 11,842,988 B2
(45) Date of Patent: Dec. 12, 2023

(54) DISPLAY DEVICE AND METHOD OF MANUFACTURING THE SAME

(71) Applicant: Samsung Display Co., Ltd., Yongin-si (KR)

(72) Inventors: Tae Gyun Kim, Yongin-si (KR); Jun Hong Park, Yongin-si (KR); Jun Chun, Yongin-si (KR); Eui Suk Jung, Yongin-si (KR); Hyun Young Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 182 days.

(21) Appl. No.: 17/089,856

(22) Filed: Nov. 5, 2020

(65) Prior Publication Data
US 2021/0202452 A1 Jul. 1, 2021

(30) Foreign Application Priority Data
Dec. 30, 2019 (KR) .................. 10-2019-0178412

(51) Int. Cl.
H01L 25/16 (2023.01)
H01L 33/62 (2010.01)
H01L 25/075 (2006.01)

(52) U.S. Cl.
CPC ........ *H01L 25/167* (2013.01); *H01L 25/0753* (2013.01); *H01L 33/62* (2013.01); *H01L 2933/0066* (2013.01)

(58) Field of Classification Search
CPC ... H01L 25/167; H01L 25/0753; H01L 33/62; H01L 33/0062–0075; H01L 33/30–325; H01L 2933/0066
See application file for complete search history.

(56) References Cited

U.S. PATENT DOCUMENTS

| 10,490,537 B2 | 11/2019 | Bae et al. | |
| 2011/0108872 A1* | 5/2011 | Kim | H01L 33/38 257/E33.074 |
| 2011/0147763 A1* | 6/2011 | Hanawa | H01L 21/0254 257/E33.025 |
| 2018/0175104 A1* | 6/2018 | Kang | H01L 33/005 |
| 2018/0175106 A1* | 6/2018 | Kim | H01L 25/167 |
| 2019/0081261 A1 | 3/2019 | Lee et al. | |
| 2019/0244985 A1* | 8/2019 | Kim | H01L 27/124 |

FOREIGN PATENT DOCUMENTS

| KR | 10-2019-0029831 A | 3/2019 | |
| KR | 10-2019-0067296 A | 6/2019 | |
| WO | WO-2020105809 A1 * | 5/2020 | ......... H01L 25/0753 |

* cited by examiner

Primary Examiner — Lauren R Bell

(74) Attorney, Agent, or Firm — Lewis Roca Rothgerber Christie LLP

(57) ABSTRACT

A display device includes: a pixel circuit layer including a plurality of transistors; first partition wall and a second partition wall on the pixel circuit layer, each of the first and second partition walls having a shape protruding in a thickness direction; a first electrode and a second electrode on the same layer and respectively on the first partition wall and the second partition wall; a light emitting element between the first electrode and the second electrode; and a semiconductor pattern directly on the first electrode.

12 Claims, 22 Drawing Sheets

FIG. 7
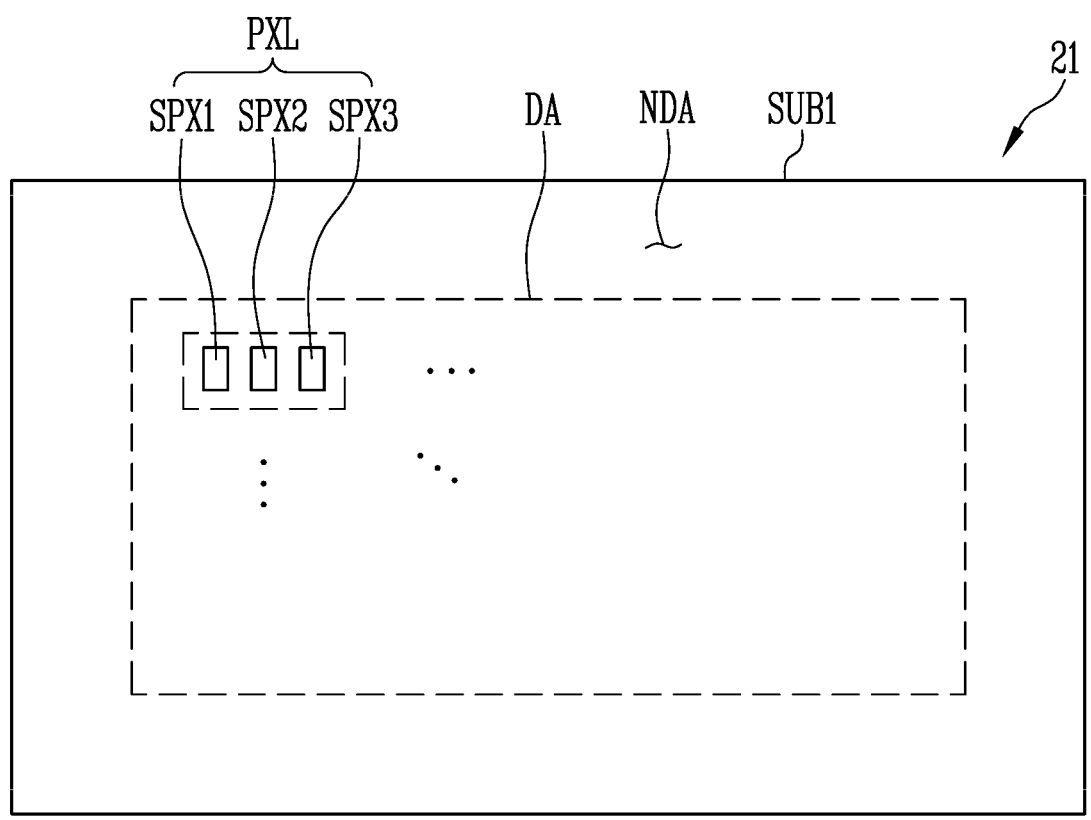
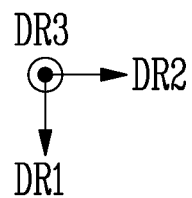

DISPLAY DEVICE AND METHOD OF MANUFACTURING THE SAME

CROSS-REFERENCE TO RELATED APPLICATION

This application claims priority to and the benefit of Korean patent application number 10-2019-0178412 filed in the Korean Intellectual Property Office on Dec. 30, 2019, the entire disclosure of which is incorporated herein in its entirety by reference.

BACKGROUND

1. Field

Aspects of embodiments of the present disclosure relate to a display device and a method of manufacturing the same.

2. Description of Related Art

The importance of a display device is increasing with the development of multimedia. Accordingly, various types of display devices, such as an organic light emitting diode (OLED) display and a liquid crystal display (LCD), are used.

A display device generally includes a display panel, such as an organic light emitting display panel or a liquid crystal display panel, to display an image. The organic light emitting display panel may include a light emitting element. Examples of the light emitting element include a light emitting diode (LED), such as an organic light emitting diode (OLED) using organic material as fluorescent material or an inorganic light emitting diode using inorganic material as fluorescent material.

The inorganic light emitting diode using an inorganic semiconductor as the fluorescent material is durable even in a high-temperature environment, and exhibits greater efficiency of blue light compared to the organic light emitting diode. Furthermore, a transfer method using a dielectrophoresis (DEP) method has been developed to overcome the limitations of a manufacturing process for a conventional inorganic light emitting diode element. Thus, research into inorganic light emitting diodes having excellent durability and efficiency compared to the organic light emitting diode is continuously made.

SUMMARY

Various embodiments of the present disclosure are directed to a method of manufacturing a display device including nano-scale to micro-scale light emitting elements with a reduced number of masks.

The present disclosure is not limited to the above-described aspects and features, and other aspects and features that are not mentioned above will be clearly understood by those skilled in the art from the following description.

An embodiment of the present disclosure provides a display device including: a pixel circuit layer including a plurality of transistors; a first partition wall and a second partition wall on the pixel circuit layer, each of the first and second partition walls having a shape protruding in a thickness direction; a first electrode and a second electrode on the same layer and respectively on the first partition wall and the second partition wall; a light emitting element between the first electrode and the second electrode; and a semiconductor pattern directly on the first electrode.

The display device may further include a first contact electrode on the semiconductor pattern.

The display device may further include a second contact electrode contacting a first end of the light emitting element and the second electrode.

The semiconductor pattern may overlap the first contact electrode and may not overlap the second contact electrode.

The first contact electrode and the second contact electrode may be on different layers.

The second contact electrode, the semiconductor pattern, and the first contact electrode may be sequentially stacked.

The semiconductor pattern may be conductive when a voltage having a reference level or more is applied to the first electrode.

When the voltage having the reference level or more is applied to the first electrode, the first contact electrode may electrically connect the first electrode with the light emitting element.

The semiconductor pattern may contact a second end of the light emitting element.

An upper surface of the first contact electrode and an upper surface of the second contact electrode may each have an uneven surface.

The display device may further include an insulating layer between the light emitting element and the second contact electrode.

The insulating layer may have an area overlapping the first contact electrode, an area overlapping the second contact electrode, and an area overlapping neither the first contact electrode nor the second contact electrode.

A height of the area overlapping the first contact electrode or a height of the area overlapping the second contact electrode may be greater than a height of the area overlapping neither the first contact electrode nor the second contact electrode.

The insulating layer may have a groove in an upper surface thereof.

The semiconductor pattern may include n+ silicon.

Another embodiment of the present disclosure provides a method of manufacturing a display device. The display device includes a pixel circuit layer including a plurality of transistors, a first partition wall and a second partition wall on the pixel circuit layer, each of the first and second partition walls having a shape protruding in a thickness direction, and a first electrode and a second electrode respectively on the first partition wall and the second partition wall. The method includes: arranging a light emitting element between the first electrode and the second electrode; forming a second contact electrode contacting the second electrode and a first end of the light emitting element; and disposing a semiconductor layer to cover the first electrode, the second electrode, and the second contact electrode.

The method may further include forming a first contact electrode on the semiconductor layer.

The method may further include performing an etching process after the forming of the first contact electrode.

The etching process may include a dry etching process.

The method may further include forming a semiconductor pattern overlapping the first contact electrode by etching the semiconductor layer.

Additional details of various embodiments are included in the detailed descriptions and drawings.

BRIEF DESCRIPTION OF THE DRAWINGS

FIG. 7 is a conceptual view illustrating a display device according to an embodiment of the present disclosure.

DETAILED DESCRIPTION

Figure 1:
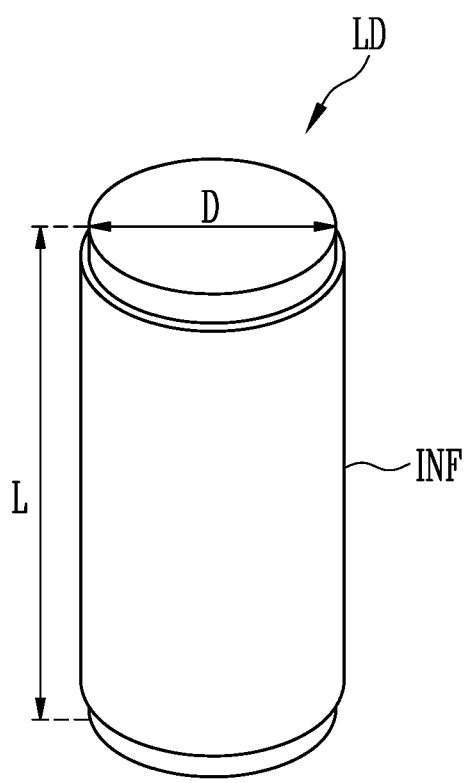
FIGS. 1 and 2 are a perspective view and a sectional view, respectively, illustrating a light emitting element according to an embodiment of the present disclosure.

Aspects and features of the present disclosure, and methods for achieving the same, will be described with reference to example embodiments described below, in detail, together with the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art. The present disclosure is to be defined by the appended claims and their equivalents.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present.

In the figures, dimensions of the various elements, layers, etc. may be exaggerated for clarity of illustration. Like reference numerals refer to like elements throughout.

It will be understood that, although the terms "first," "second," etc. may be used herein to describe various elements, these elements should not be limited by these terms. These terms are used to distinguish one element from another element. For instance, a first element discussed below could be termed a second element without departing from the teachings of the present disclosure. In the present disclosure, the singular forms are intended to include the plural forms as well, unless the context clearly indicates otherwise. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Herein, elements formed on the same layer mean elements that contain the same material and are substantially simultaneously formed. Furthermore, elements formed on different layers are formed at different times. The elements may contain different materials, but may contain the same material.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, embodiments of the present disclosure will be described, in detail, with reference to the accompanying drawings. In the drawings, same or similar reference numerals are used to designate the same or similar elements.

Figure 2:
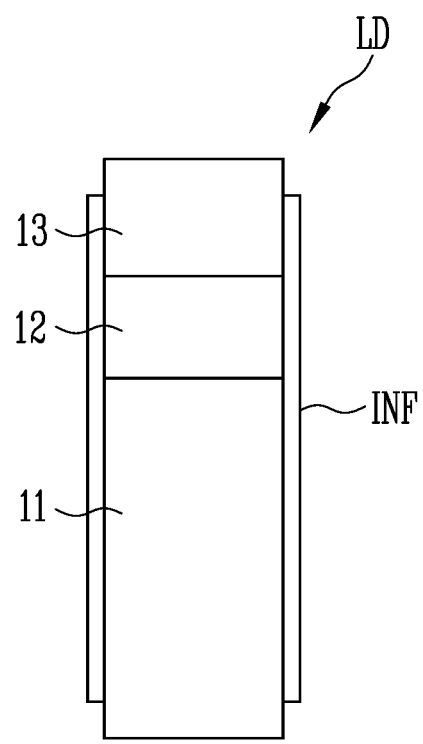

FIGS. 1 and 2 are a perspective view and a sectional view, respectively, illustrating a light emitting element according to an embodiment of the present disclosure. Although a rod-type light emitting element LD having a cylindrical shape is illustrated in FIGS. 1 and 2, the type and/or shape of the light emitting element LD is not limited thereto.

Referring to FIGS. 1 and 2, the light emitting element LD may include a first conductive electrode layer 11, a second conductive electrode layer 13, and an active layer 12 interposed between the first and second conductive electrode layers 11 and 13. For example, the light emitting element LD may be configured as a stacked body formed by successively (or sequentially) stacking the first conductive electrode layer 11, the active layer 12, and the second conductive electrode layer 13 in one direction.

In an embodiment, the light emitting element LD may be provided in the form (or shape) of a rod extending in the one direction. The light emitting element LD may have a first end and a second end in the one direction.

In an embodiment, one of the first and second conductive electrode layers 11 and 13 may be disposed on the first end of the light emitting element LD, and the other one of the first and second conductive electrode layers 11 and 13 may be disposed on the second end of the light emitting element LD.

In an embodiment, the light emitting diode LD may be a rod-type light emitting diode manufactured in the form of a rod (e.g., having a rod-like shape). Here, the term "rod-like shape" includes not only a rod-like shape but also a bar-like shape, such as a cylindrical shape and a prismatic shape that is longer in a longitudinal direction than in a width direction (i.e., a shape having an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a relatively small size corresponding to a nano scale or a micro scale (e.g., a diameter D and/or a length L corresponding to a micro scale, for example, about 1 µm to about 100 µm, or nano scale, for example, about 1 nm to about 100 nm, range). However, the size of the light emitting element LD is not limited to these example ranges. For example, the size of the light emitting element LD may be suitable modified or changed depending on design conditions of various devices, such as a display device, which employs, as a light source, a light emitting device using a light emitting element LD.

The first conductive electrode layer 11 may include at least one n-type semiconductor material. For instance, the first conductive electrode layer 11 may include an n-type semiconductor material which includes any semiconductor material including InAlGaN, GaN, AlGaN, InGaN, AlN, and InN, and is doped with a first conductive dopant, such as Si, Ge, or Sn. However, the material of the first conductive electrode layer 11 is not limited to these examples, and the first conductive electrode layer 11 may be formed of various other suitable materials.

The active layer 12 may be disposed on the first conductive electrode layer 11 and have a single or multiple quantum well structure. In an embodiment, a cladding layer doped with a conductive dopant may be formed on and/or under the active layer 12. For example, the cladding layer may be formed of an AlGaN layer or an InAlGaN layer. In an embodiment, a material, such as AlGaN or AlInGaN, may be used to form the active layer 12, and various other suitable materials may be used to form the active layer 12.

When a voltage of a threshold voltage or greater is applied to the opposite ends of the light emitting element LD, the light emitting element LD may emit light by coupling of electron-hole pairs in the active layer 12. Light emission from the light emitting element LD can be controlled based on the foregoing principle. Thus, the light emitting element LD may be used as a light source of various light emitting devices as well as in a pixel of the display device.

The second conductive electrode layer 13 may be disposed on the active layer 12 and may include a semiconductor material of a type different from that of the first conductive electrode layer 11. For example, the second conductive electrode layer 13 may include at least one p-type semiconductor material. For instance, the second conductive electrode layer 13 may include a p-type semiconductor material which includes any semiconductor material of InAlGaN, GaN, AlGaN, InGaN, AlN, and InN and is doped with a second conductive dopant, such as Mg. However, the material forming the second conductive electrode layer 13 is not limited to this, and the second conductive electrode layer 13 may be formed of various other suitable materials.

In an embodiment, the light emitting element LD may further include an insulating film INF provided on the surface of the light emitting diode LD. In an embodiment, the insulating film INF may be formed on the surface of the light emitting element LD to enclose an outer circumferential surface of at least the active layer 12. In addition, the insulating film INF may further enclose at least an area of (e.g., at least a peripheral portion of) each of the first and second conductive electrode layers 11 and 13. Here, the insulating film INF may expose the opposite ends of the light emitting element LD that have different polarities to the outside. For example, the insulating film INF may expose one end of each of the first and second conductive electrode layers 11 and 13 that are disposed on the respective opposite ends of the light emitting element LD in the longitudinal direction (e.g., the insulating film INF may expose two surfaces, such as top and bottom surfaces, of the cylinder rather than covering them).

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but it is not limited thereto. In other words, the material forming the insulating film INF is not limited to a particular material, and the insulating film INF may be formed of various suitable insulating materials.

In an embodiment, the light emitting element LD may further include additional other components in addition to the first conductive electrode layer 11, the active layer 12, the second conductive electrode layer 13, and/or the insulating film INF. For example, the light emitting element LD may further include at least one fluorescent layer, at least one active layer, at least one semiconductor material and/or at least one electrode layer disposed on one end of the first conductive electrode layer 11, the active layer 12, and/or the second conductive electrode layer 13.

Figure 3:
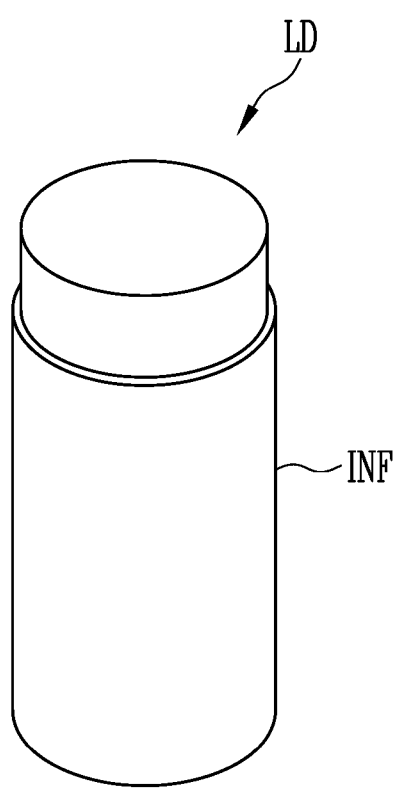
FIGS. 3 and 4 are a perspective view and a sectional view, respectively, illustrating a light emitting element according to an embodiment of the present disclosure.
Figure 4:
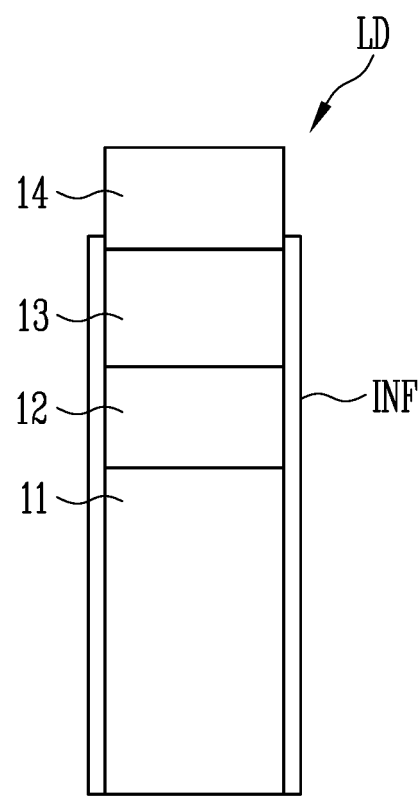
Figure 5:
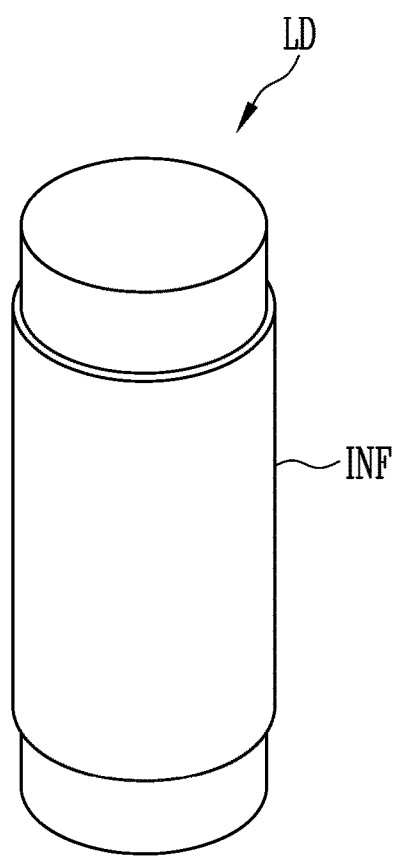
FIGS. 5 and 6 are a perspective view and a sectional view, respectively, illustrating a light emitting element according to an embodiment of the present disclosure.
Figure 6:
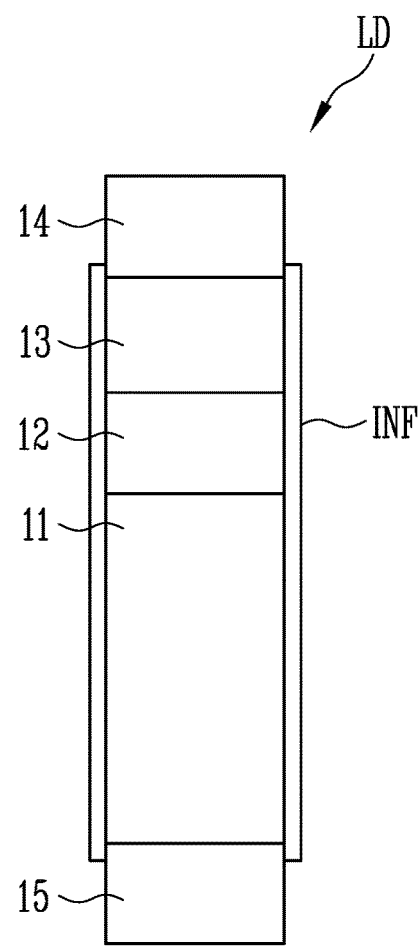

FIGS. 3 and 4 are a perspective view and a sectional view, respectively, illustrating a light emitting element according to an embodiment of the present disclosure, and FIGS. 5 and 6 are a perspective view and a sectional view, respectively, illustrating a light emitting element according to an embodiment of the present disclosure.

Referring to FIGS. 3 and 4, the light emitting element LD may further include at least one electrode layer 14 disposed on one end of the second conductive electrode layer 13.

Referring to FIGS. 5 and 6, the light emitting element LD may further include at least one electrode layer 15 disposed on one end of the first conductive electrode layer 11.

Each of the electrode layers 14 and 15 may be an ohmic contact electrode, but it is not limited thereto. Furthermore, each of the electrode layers 14 and 15 may include metal or a conductive metal oxide. For example, each of the electrode layers 14 and 15 may include (or may be formed of) transparent electrode materials, such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO), alone or in combination. The electrode layers 14 and 15 may be substantially transparent or semitransparent. Thereby, light generated from the light emitting element LD may be emitted to the outside after passing through the electrode layers 14 and 15.

In an embodiment, the insulating film INF may at least partially enclose the outer surfaces of the electrode layers 14 and 15, or may not enclose (or entirely enclose or surround) them. For example, the insulating film INF may be selectively formed on the surfaces of the electrode layers 14 and 15. Furthermore, the insulating layer INF may be formed to expose the opposite ends of the light emitting element LD that have different polarities; for example, the insulating layer INF may expose at least an area of each of the electrode layers 14 and 15. However, without being limited thereto, the insulating film INF may be omitted.

When the insulating film INF is provided on the surface (e.g., on a part of the outer surface) of the light emitting element LD, for example, on the surface of the active layer 12, the active layer 12 may not short-circuit with at least one electrode, for example, at least one contact electrode from among contact electrodes coupled to the opposite ends of the light emitting element LD, etc. Consequently, the electrical stability of the light emitting element LD may be ensured.

Furthermore, the insulating film INF may be formed on the surface of the light emitting element LD, thus reducing or minimizing surface defects of the light emitting element LD and improving the lifespan and efficiency of the light emitting element LD. Moreover, when the insulating film INF is formed on the light emitting element LD, an undesired short circuit between the light emitting elements LD may be avoided even if multiple light emitting elements LD are arranged in close proximity to each other.

In an embodiment, the light emitting element LD may be manufactured through a surface treatment process (e.g., coating). For example, when the plurality of light emitting elements LD is mixed with fluid solution (or solvent) to be supplied to each light emitting area (e.g., a light emitting area of each pixel), the light emitting elements LD may be uniformly dispersed without non-uniformly aggregating in the solution. Here, the light emitting area is an area from which light is to be emitted by the light emitting elements LD. The light emitting area may be distinguished from a non-light emitting area from which light is not to be emitted.

In some embodiments, the insulating film INF itself may be formed of a hydrophobic film using hydrophobic material, or an additional hydrophobic film formed of the hydrophobic material may be formed on the insulating film INF. In an embodiment, the hydrophobic material may be a material including (or containing) fluorine to exhibit hydrophobicity. In an embodiment, the hydrophobic material may be applied to the light emitting elements LD in the form of a self-assembled monolayer (SAM). In such an embodiment, the hydrophobic material may include octadecyl trichlorosilane, fluoroalkyl trichlorosilane, perfluoroalkyl triethoxysilane, etc. Furthermore, the hydrophobic material may be a commercially available fluorine containing material, such as Teflon™ or Cytop™, or a similar or corresponding material.

A light emitting device including the light emitting element LD may be used in various devices including a display device which requires a light source. For instance, at least one subminiature light emitting element LD, for example, a plurality of subminiature light emitting elements LD each having a size ranging from a nano scale to a micro scale, may be disposed in each pixel area of the display panel to form a light source (e.g., a light source unit) of the corresponding pixel using the subminiature light emitting elements LD. The field of application of the light emitting element LD according to the present disclosure is not limited to a display device. For example, the light emitting element LD may also be used in various other devices, such as a lighting device that requires a light source.

FIG. 7 is a conceptual view illustrating a display panel according to an embodiment of the present disclosure. FIG. 7 illustrates an embodiment of a display panel that may use the light emitting elements LD shown in FIGS. 1 to 6 as the light source.

The display panel may be used as a display panel of a large display device such as a television or a monitor and small and medium display devices such as a mobile phone, a tablet, a car navigation device, a game console or a smart watch.

In an embodiment, the display panel 21 may have a rectangular shape that is longer in a second direction DR2 than in a first direction DR1. The thickness direction of the display panel 21 is indicated by a third direction DR3. However, because the directions indicated by the first to third directions DR1, DR2, and DR3 are relative concepts, each direction may be converted into another direction.

Hereinafter, the first to third directions DR1, DR2, and DR3 refer to the same reference numerals in the directions indicated by the first to third directions DR1, DR2, and DR3, respectively. The display panel 21 may have various shapes without being limited to the shape shown in the drawings.

The display panel 21 may include a base layer (or substrate) SUB1 and pixels PXL disposed on the base layer SUB1 For example, the base layer SUB1 of the display panel 21 may have a display area DA configured to display an image and a non-display area NDA in an area other than (e.g., surrounding a periphery of) the display area DA.

The display area DA and the non-display area NDA may be defined in the substrate SUB1. In an embodiment, the display area DA may be disposed in a central portion of the display panel 21, and the non-display area NDA may be disposed in a perimeter portion of the display panel 21 to enclose (e.g., to surround a periphery of) the display area DA. The locations of the display area DA and the non-display area NDA are not limited to this, and the locations thereof may be changed.

The base layer SUB1 may form a base member (or base layer) of the display panel. For example, the base layer SUB1 may form a base member of a lower panel (e.g., a lower plate of the display panel).

The base layer SUB1 may be a rigid or flexible substrate, and the material and/or properties thereof are not particularly limited. For example, the base layer SUB1 may be a rigid substrate made of glass or reinforced glass, or a flexible substrate formed of a thin film made of plastic or metal. Furthermore, the base layer SUB1 may be a transparent substrate, but it is not limited thereto. For instance, the base layer SUB1 may be a translucent substrate, an opaque substrate, or a reflective substrate.

An area on the base layer SUB1 is defined as the display area DA in which the pixels PXL are disposed, and the other (or remaining) area thereof is defined as the non-display area NDA. For example, the base layer SUB1 may have the display area DA including a plurality of pixel areas on which the pixels PXL are formed, and the non-display area NDA disposed around the display area DA. Various lines and/or internal circuits which are coupled to the pixels PXL may be disposed in the non-display area NDA.

Each of the pixels PXL may include at least one light emitting element LD (e.g., at least one rod-type light emitting diode according to any one of embodiments illustrated in FIGS. 1 to 6), which is driven by a corresponding scan signal and a corresponding data signal. For example, the pixel PXL may include a plurality of rod-type light emitting diodes, each of which has a small size ranging from a nano scale to a micro scale, which are coupled to each other in parallel. The plurality of rod-type light emitting diodes may form a light source of each pixel PXL.

Furthermore, the pixel PXL may include a plurality of sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit light of different colors. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types, and/or number of sub-pixels forming each pixel PXL are not particularly limited. For example, the color of light emitted from each of the sub-pixels SPX1, SPX2, and SPX3 may be changed in various suitable ways. Although FIG. 7 shows that the sub-pixels SPX1, SPX2, and SPX3 are arranged in the display area DA in a stripe shape, the present disclosure is not limited thereto. For example, the pixels PXL may be arranged in various suitable pixel array forms.

Figure 9:
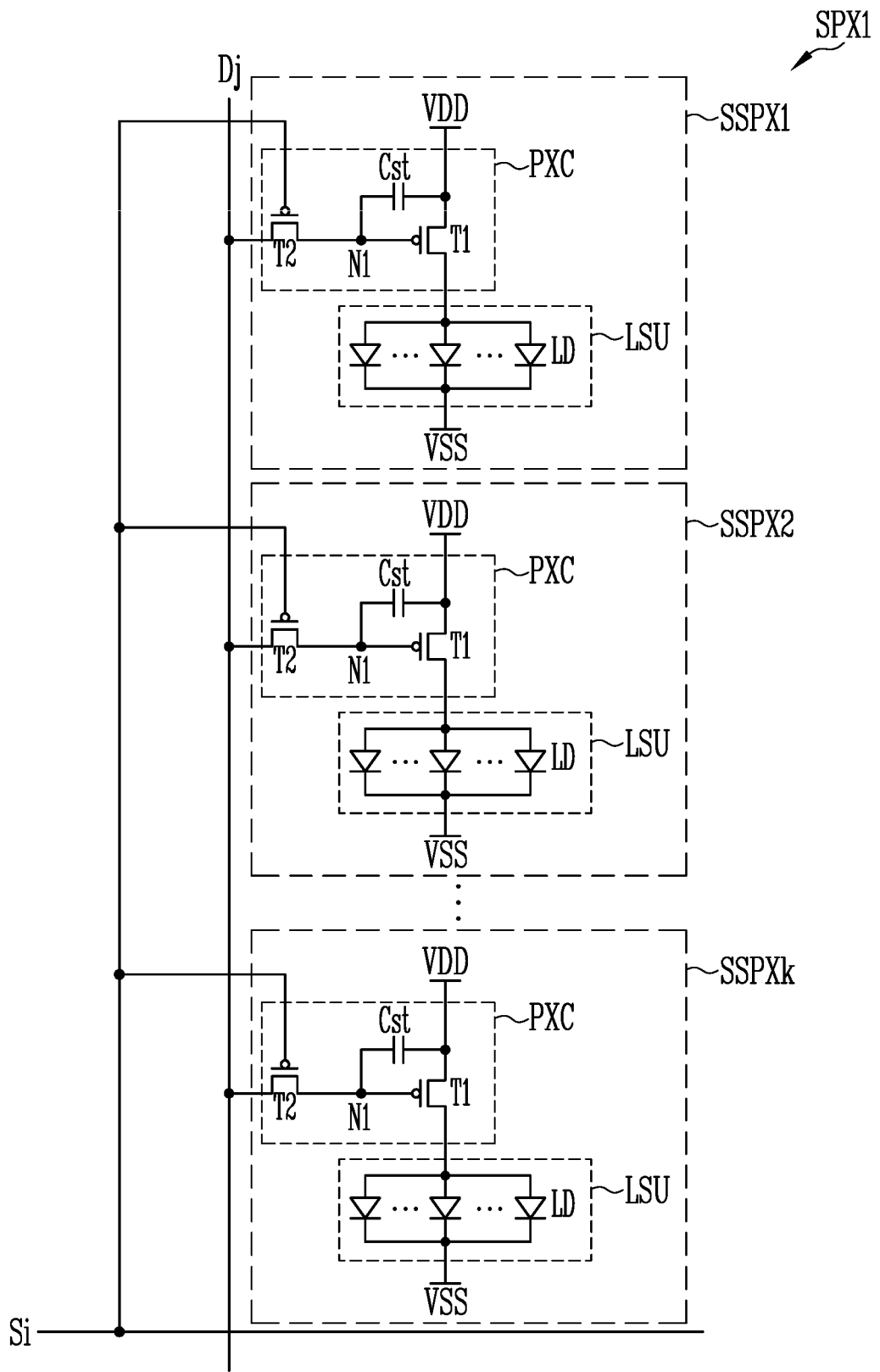
FIGS. 9 to 12 are circuit diagrams illustrating example configurations applicable to the unit pixel included in the sub-pixel shown in FIG. 8.

In an embodiment, each of the sub-pixels SPX1, SPX2, and SPX3 may include a plurality of unit pixels SSPX1, SSPX2, and SSPX3 (see, e.g., FIG. 9).

Further, a plurality of pads may be disposed in the non-display area NDA. Lines in the display panel 21 may be electrically coupled to a driver IC located outside the display panel 21 through the pads.

Figure 8:
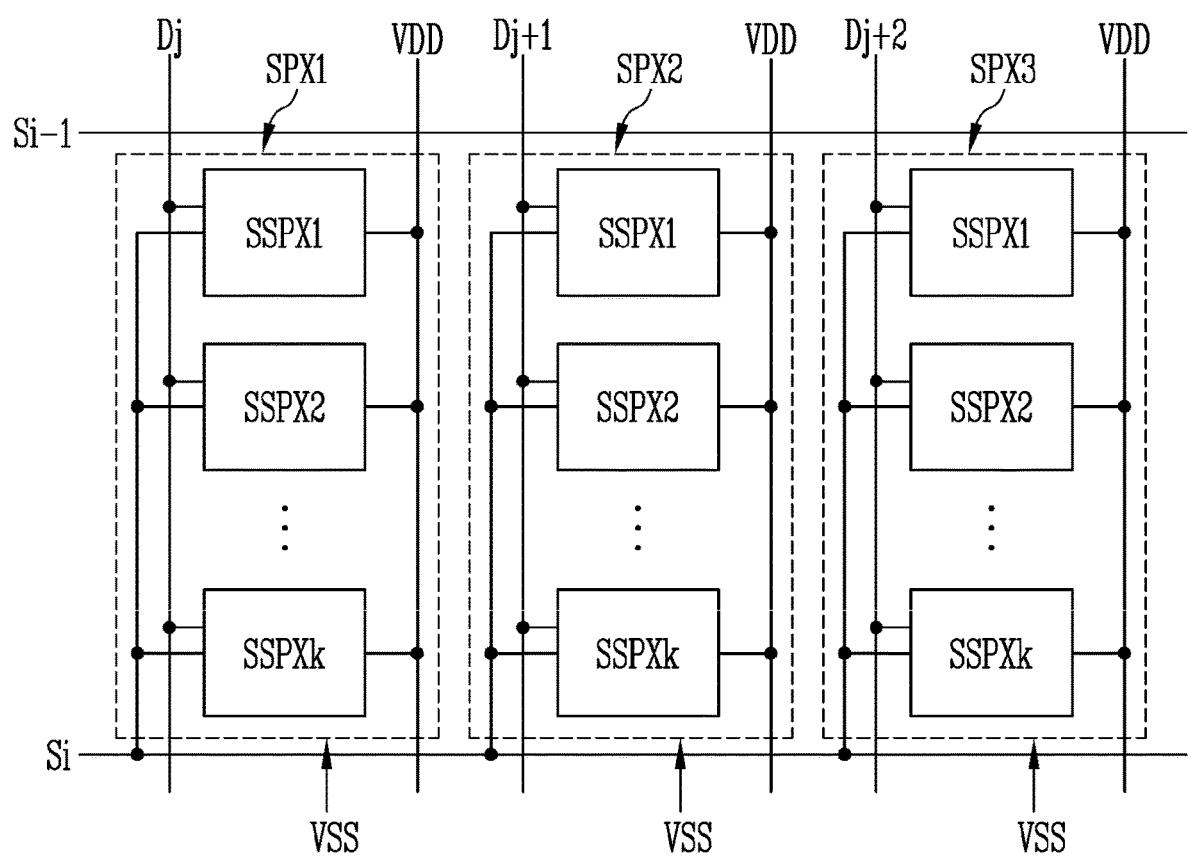
FIG. 8 is a circuit diagram illustrating an example of sub-pixels included in the display panel shown in FIG. 7.

FIG. 8 is a circuit diagram illustrating an example of the sub-pixels included in the display panel shown in FIG. 7. FIG. 8 illustrates the first to third sub-pixels SPX1, SPX2, and SPX3 included in the display panel shown in FIG. 7.

Because the first to third sub-pixels SPX1, SPX2, and SPX3 are substantially similar to each other except that the first to third sub-pixels SPX1, SPX2, and SPX3 are respectively coupled to data lines Dj, Dj+1, and Dj+2, only the first sub-pixel SPX1 will be described in detail.

The first to third sub-pixels SPX1, SPX2, and SPX3 may be disposed in areas, respectively, which are partitioned by scan lines Si−1 and Si (i is a natural number) and data lines Dj, Dj+1, and Dj+2 (j is a natural number). For example, the first sub-pixel SPX1 may be disposed in an area defined by i−1-th and i-th scan lines Si−1 and Si and j-th and j+1-th data lines Dj and Dj+1. However, the arrangement of the first to third sub-pixels SPX1, SPX2, and SPX3 is not limited thereto.

The first sub-pixel SPX1 may be coupled to the scan line Si and the data line Dj and may also be coupled to a first power supply line and a second power supply line. Here, a first power supply VDD may be applied to the first power supply line, and a second power supply VSS may be applied to the second power supply line. Each of the first and second power supply lines may be a common line coupled to the plurality of sub-pixels. The first and second power supplies VDD and VSS may have different potentials to allow the sub-pixels to emit light. For example, the first power supply VDD may have a voltage level higher than that of the second power supply VSS.

In an embodiment, the first sub-pixel SPX1 may include at least one unit pixel SSPX1 to SSPXk (k is a natural number). FIG. 9 shows circuit diagrams of the unit pixels SSPX1 to SSPXk (k is a natural number) of the first sub-pixel SPX1 shown in FIG. 8.

Each of the unit pixels SSPX1 to SSPXk may be coupled to the scan line Si and the data line Dj, and may also be coupled to the first power supply line and the second power supply line. Each of the unit pixels SSPX1 to SSPXk may emit light having a luminance corresponding to a data signal transmitted through the data line Dj in response to a scan signal transmitted through the scan line Si. The unit pixels SSPX1 to SSPXk may have substantially the same pixel structure or pixel circuit.

In other words, the first sub-pixel SPX1 may include unit pixels SSPX1 to SSPXk that independently emit light in response to one scan signal and one data signal (e.g., in response to the same scan signal and the same data signal).

In an embodiment, each of the unit pixels SSPX1 to SSPXk (or sub-pixels SPX1 to SPX3) may be configured as an active pixel. However, the types, structures, and/or driving schemes of the unit pixels capable of being applied to the present disclosure are not particularly limited. For example, the unit pixel may be configured as the pixel of the display panel having various suitable passive or active structures.

FIGS. 9 to 12 are circuit diagrams illustrating an example applicable to the unit pixel included in the sub-pixel shown in FIG. 8.

Each drawing will be described based on one unit pixel. Since the description of the first to the k-th unit pixels SSPX1 to SSPXk shown in FIG. 8 may be applied to FIGS. 9 to 12, similar description thereof will be omitted herein. That is, the first to the k-th unit pixels SSPX1 to SSPXk shown in FIG. 8 have substantially the same or similar structure as shown, for example, in FIG. 9. The first unit pixel SSPX1 shown in FIGS. 9 to 12 is illustrative and may be equally or similarly applied to any one of the first to the k-th unit pixels SSPX1 to SSPXk shown in FIG. 8.

First, referring to FIG. 9, the unit pixel SSPX1 may include a light source unit LSU that emits light having a luminance corresponding to a data signal. The unit pixel SSPX1 may selectively further include a pixel circuit PXC configured to drive the light source unit LSU.

In an embodiment, the light source unit LSU may include a plurality of light emitting elements LD that are electrically coupled to each other between the first power supply VDD and the second power supply VSS. In an embodiment, the light emitting elements LD may be coupled in parallel to each other, without being limited thereto. For example, the plurality of light emitting elements LD may be coupled in parallel between the first power supply VDD and the second power supply VSS.

The first and second power supplies VDD and VSS may have different potentials to allow (e.g., to cause) the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more at least during a light emitting period of the unit pixel SSPX1 (or of the first sub-pixel SPX1).

Although an embodiment in which the light emitting elements LD are coupled in parallel in the same direction (e.g., in a forward direction) between the first power supply VDD and the second power supply VSS is shown in FIG. 9, the present disclosure is not limited to this configuration. For example, some of the light emitting elements LD may be coupled to each other in the forward direction between the first and second power supplies VDD and VSS, thus forming respective effective light sources, and the other light emitting elements LD may be coupled to each other in the reverse direction. In another embodiment, the unit pixel SSPX1 may include only a single light emitting element LD (e.g. single effective light source coupled in the forward direction between the first and second power supplies VDD and VSS).

According to an embodiment, the first end of each of the light emitting elements LD may be coupled in common to an associated pixel circuit PXC through a first electrode, and may be coupled to the first power supply VDD through the pixel circuit PXC and the first power supply line. The second end of each of the light emitting elements LD may be coupled in common to the second power supply VSS through the second electrode and the second power supply line.

The light source unit LSU may emit light having a luminance corresponding to a driving current supplied thereto through the corresponding pixel circuit PXC. Thereby, an image (e.g., a predetermined image) may be displayed on the display area DA (see, e.g., FIG. 4).

The pixel circuit PXC may be coupled to the scan line Si and the data line Dj of the corresponding sub-pixel (e.g., the first sub-pixel SPX1 in FIG. 9). For example, when the first sub-pixel SPX1 is disposed on an i-th row and a j-th column of the display area DA, the pixel circuit PXC of the unit pixel SSPX may be coupled to the i-th scan line Si and the j-th data line Dj of the display area DA.

Referring to FIG. 9, the pixel circuit PXC may include a first transistor T1, a second transistor T2, and a storage capacitor Cst.

The first transistor (e.g., driving transistor) T1 may be coupled between the first power supply VDD and the light source unit LSU. A gate electrode of the first transistor T1 may be coupled to the first node N1. The first transistor T1 may control the driving current to be supplied to the light source unit LSU in response to a voltage at the first node N1.

The second transistor (e.g., switching transistor) T2 may be coupled between the data line Dj and the first node N1. A gate electrode of the second transistor T2 may be coupled to the scan line Si.

In response to a scan signal having a gate-on voltage (e.g., a low voltage) supplied from the scan line Si, the second transistor T2 may be turned on to electrically couple the first node N1 to the data line Dj.

During each frame period, a data signal of a corresponding frame is supplied to the data line Dj. The data signal may be transmitted to the first node N1 via the second transistor T2. Thereby, a voltage corresponding to the data signal may be charged to the storage capacitor Cst.

The first electrode of the storage capacitor Cst may be coupled to the first power supply VDD, and the second electrode thereof may be coupled to the first node N1. The storage capacitor Cst may charge voltage corresponding to a data signal supplied to the first node N1 during each frame period and may maintain the charged voltage until a data signal of a subsequent frame is supplied.

Although in FIG. 9 the transistors (e.g., the first and second transistors T1 and T2) included in the pixel circuit PXC have been illustrated as being a P-type transistors, the present disclosure is not limited to this. For example, any one of the first and second transistors T1 and T2 may be an N-type transistor.

Figure 10:
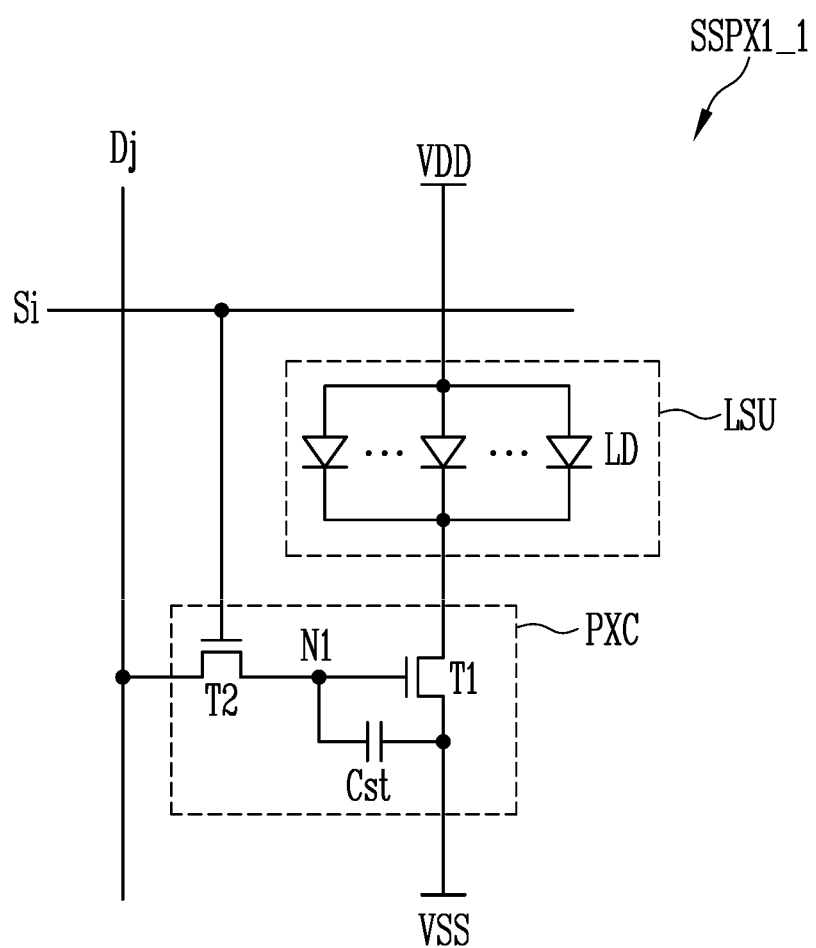

Referring to FIG. 10, both the first and second transistors T1 and T2 are N-type transistors. In this embodiment, the gate-on voltage of the scan signal for writing the data signal supplied to the data line Dj in each frame period in the unit pixel SSPX1_1 may be a high level voltage. Similarly, the voltage of the data signal for turning on the first transistor T1 may be a waveform voltage opposite to that of the embodiment shown in FIG. 9. By way of example, in the embodiment shown in FIG. 10, as a gray scale value that is to be expressed increases, a data signal having a higher voltage level may be supplied.

The unit pixel SSPX1_1 shown in FIG. 10 is substantially similar in configuration and operation to the unit pixel SSPX1 shown in FIG. 9, except that the connection positions of some circuit elements and the voltage levels of control signals (e.g., the scan signal and the data signal) are changed depending on a change in transistor type. Therefore, detailed description of the unit pixel SSPX1_1 shown in FIG. 10 will be omitted.

The structure of the pixel circuit PXC is not limited to the embodiments shown in FIGS. 9 and 10. In other words, the pixel circuit PXC may be formed of a pixel circuit that may have various suitable structures and/or may be operated by various suitable driving schemes. For example, the pixel circuit PXC may be configured in the same manner as that of an embodiment illustrated in FIG. 11.

Figure 11:
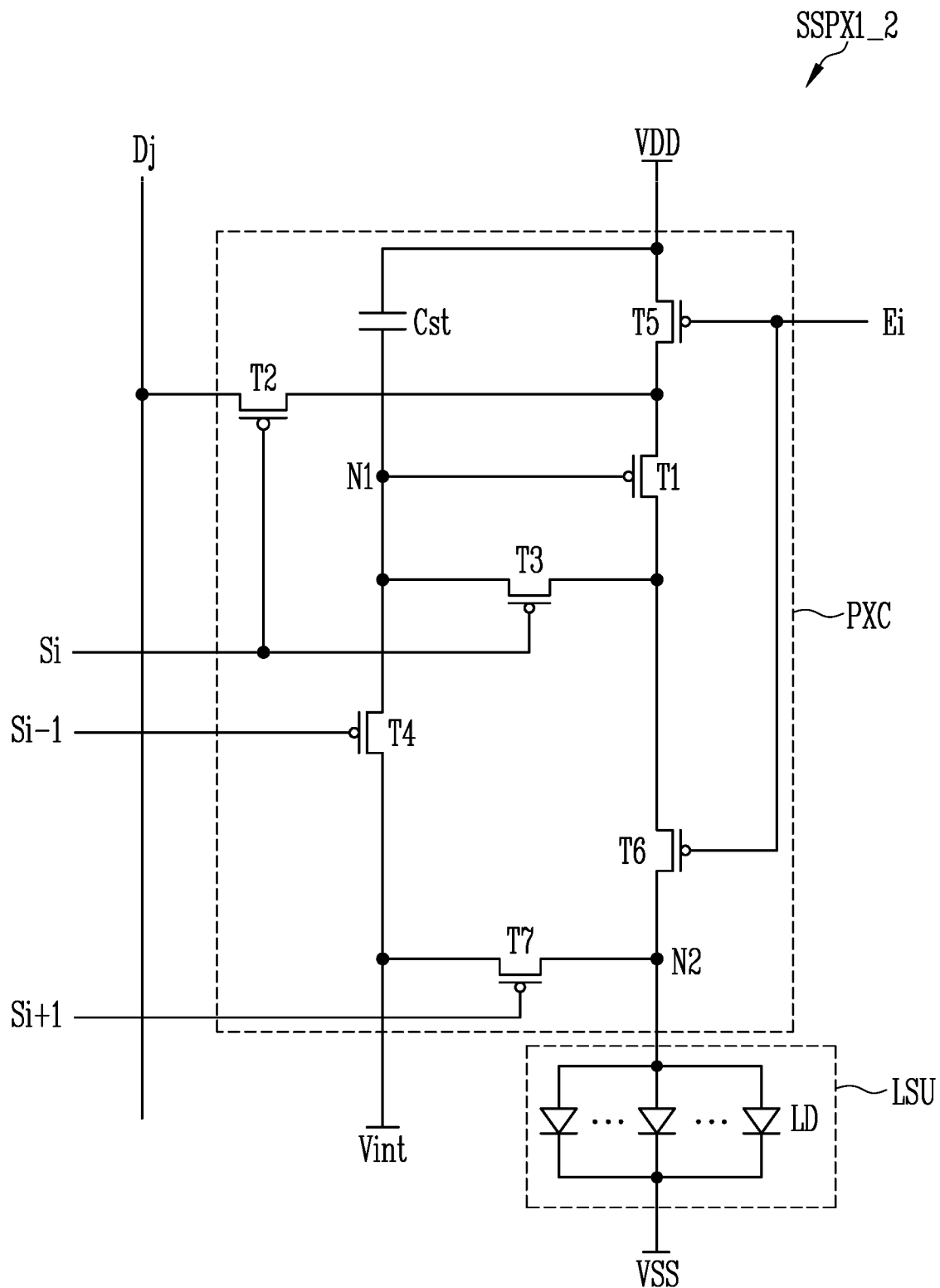

Referring to FIG. 11, the pixel circuit PXC in the unit pixel SSPX1_2 may be coupled not only to a corresponding scan line Si but also to at least one another scan line (or a control line). For example, the pixel circuit PXC of the sub-pixel SPX (or the unit pixel SSPX included therein) disposed on the i-th row of the display area DA may also be coupled to an i−1-th scan line Si−1 and/or an i+1-th scan line Si+1. In an embodiment, the pixel circuit PXC may be coupled not only to the first and second power supplies VDD and VSS but also to other power supplies. For example, the pixel circuit PXC may also be coupled to an initialization power supply Vint.

Referring to FIG. 7, the pixel circuit PXC may include seven transistors T1 to T7. The pixel circuit PXC may include first to seventh transistors T1 to T7 and a storage capacitor Cst.

The first transistor T1 may be coupled between the first power supply VDD and the light source unit LSU. The first electrode (e.g., a source electrode) of the first transistor T1 may be coupled to the first power supply VDD through the fifth transistor T5, and the second electrode (e.g., a drain electrode) of the first transistor T1 may be coupled via the sixth transistor T6 to the first electrode (e.g., a first electrode of the corresponding sub-pixel SPX) of the light source unit LSU. The gate electrode of the first transistor T1 may be coupled to the first node N1. The first transistor T1 may control driving current to be supplied to the light source unit LSU in response to a voltage at the first node N1.

The second transistor T2 may be coupled between the data line Dj and the first electrode of the first transistor T1. The gate electrode of the second transistor T2 may be coupled to the corresponding scan line Si. When a scan signal having a gate-on voltage is supplied from the scan line Si, the second transistor T2 may be turned on to electrically couple the data line Dj to the first electrode of the first transistor T1. Hence, when the second transistor T2 is turned on, a data signal supplied from the data line Dj may be transmitted to the first transistor T1.

The third transistor T3 may be coupled between the second electrode (e.g., a drain electrode) of the first transistor T1 and the first node N1. The gate electrode of the third transistor T3 may be coupled to the corresponding scan line Si. When the scan signal having the gate-on voltage is supplied from the scan line Si, the third transistor T3 may be turned on to connect the first transistor T1 in the form of a diode.

The fourth transistor T4 may be coupled between the first node N1 and an initialization power supply Vint. A gate electrode of the fourth transistor T4 may be coupled to a preceding scan line (e.g., an i−1-th scan line Si−1). When a scan signal having a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum or near minimum voltage of a data signal or less.

The fifth transistor T5 may be coupled between the first power supply VDD and the first transistor T1. A gate electrode of the fifth transistor T5 may be coupled to a corresponding emission control line (e.g., an i-th emission control line Ei). The fifth transistor T5 may be turned off when an emission control signal having a gate-off voltage (e.g., a high voltage) is supplied to the emission control line Ei and may be turned on in other cases.

The sixth transistor T6 may be coupled between the first transistor T1 and the first electrode of the light source unit LSU. A gate electrode of the sixth transistor T6 may be coupled to a corresponding emission control line (e.g., an i-th emission control line Ei). The sixth transistor T6 may be turned off when an emission control signal having a gate-off voltage is supplied to the emission control line Ei and may be turned on in other cases.

The seventh transistor T7 may be coupled between the first electrode of the light source unit LSU and the initialization power supply Vint (or third power supply line transmitting initialization power). A gate electrode of the seventh transistor T7 may be coupled to any one of scan lines of a subsequent stage (e.g., to the i+1-th scan line Si+1). When a scan signal having a gate-on voltage is supplied to the i+1-th scan line Si+1, the seventh transistor T7 may be turned on so that the voltage of the initialization power supply Vint may be supplied to the first electrode of the light source unit LSU. In this case, during an initialization period when the voltage of the initialization power supply Vint is transmitted to the power source unit LSU, the voltage of the first electrode of the light source unit LSU may be initialized.

The control signal for controlling the operation of the seventh transistor T7 may be suitably changed. For example, the gate electrode of the seventh transistor T7 may be coupled to a scan line of a corresponding horizontal line, namely, an i-th scan line Si. In this case, when a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be coupled between the first power supply VDD and the first node N1. The storage capacitor Cst may store a voltage corresponding both to the data signal applied to the first node N1 during each frame period and to the threshold voltage of the first transistor T1.

Although FIG. 11 shows an embodiment in which the transistors (e.g., the first to seventh transistors T1 to T7) included in the pixel circuit PXC in the unit pixel SSPX1_2 are P-type transistors, the present disclosure is not limited to this. For example, at least one of the first to seventh transistors T1 to T7 may be an N-type transistor.

In an embodiment, the pixel circuit PXC may be further coupled to another line as well as to the data line Dj.

Figure 12:
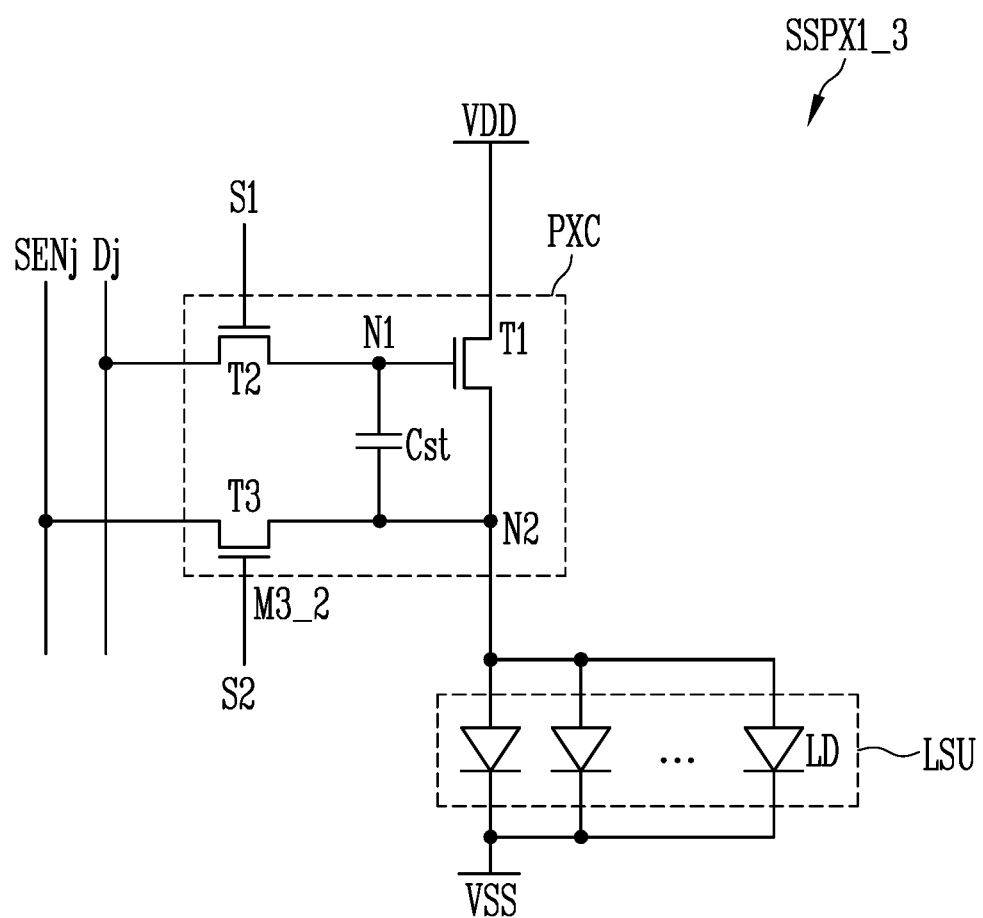

Referring to FIG. 12, the pixel circuit PXC in the unit pixel SSPX1_3 may be coupled to a sensing line SENj. The pixel circuit PXC may include first to third transistors T1 to T3 and a storage capacitor Cst. Because the first and second transistors T1 and T2 and the storage capacitor Cst are substantially the same or similar to the first and second transistors T1 and T2 and the storage capacitor Cst described with reference to FIG. 10, a duplicate description thereof is omitted.

The third transistor T3 may be coupled between the sensing line SENj and the second node N2. The gate electrode of the third transistor T3 may be coupled to the first scan line S1 and a second scan line S2 (e.g., a j-th scan line Sj and a j+1-th scan line Sj+1).

The light source unit LSU may be coupled between the second node N2 and the second power supply line (e.g., the power supply line to which the second power supply VSS is applied).

The third transistor T3 may be turned on in response to the scan signal having the gate-on voltage transmitted from the second scan line S2 to electrically couple the sensing line SENj to the second node N2.

For example, when the third transistor T3 is turned on with driving current corresponding to a reference voltage flowing through the first transistor T1, the driving current flowing through the first transistor T1 may be provided to an external sensing device through the third transistor T3 and the sensing line SENj, and a signal corresponding to the characteristics of the first transistor T1 (e.g. Vth) based on the driving current may be output through the sensing line SENj to an external device.

The structure of the unit pixel SSPXL1, which may be applied to the present disclosure, is not limited to the embodiments illustrated in FIGS. 9 through 12, and each unit pixel SSPXL1 may have various suitable structures. For example, the pixel circuit PXC included in the unit pixel SSPXL1 may be formed of a suitable pixel circuit having various suitable structures and/or may be operated by various suitable driving schemes. The unit pixel SSPX1 may be part of a passive light emitting display panel or the like. In this case, the pixel circuit PXC may be omitted, and each of the first and second pixel electrodes of the light source unit LSU may be directly coupled to the scan line Si, the data line Dj, a power line, and/or the control line.

Figure 13:
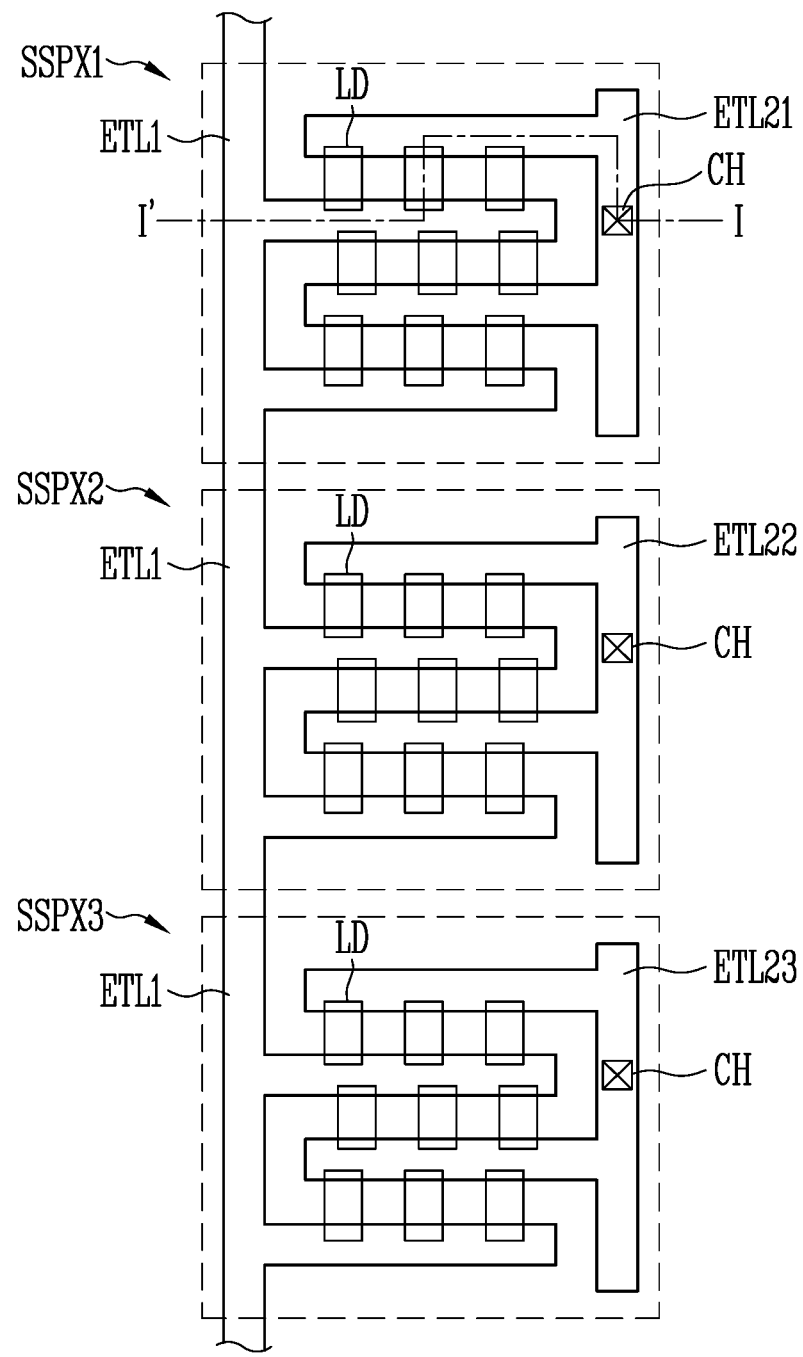
FIG. 13 is a planar layout diagram illustrating the arrangement of some components in one sub pixel included in the display panel shown in FIG. 7.

FIG. 13 is a planar layout diagram illustrating the arrangement of some components in one sub pixel included in the display panel shown in FIG. 7. FIG. 13 illustrates the structure of the light emitting unit LSU of the unit pixels SSPX1 to SSPX3 around (see, e.g., FIGS. 9 to 12) (or light-emitting-element layer). Because the first to third unit pixels SSPX1 to SSPX3 are substantially equal to each other, the light emitting unit LSU will be described based on the first unit pixel SSPX1.

Referring to FIG. 13, each of the first through third unit pixels SSPX1, SSPX2, and SSPX3 may include a first electrode ETL1, may respectively include second electrodes ETL21, ETL22, and ETL23, which are spaced apart from each other, and may include at least one light emitting element LD coupled between the first electrode ETL1 and the corresponding one of the second electrodes ETL21, ETL22, and ETL23.

In an embodiment, the light emitting elements LD included in the same unit pixel SSPX1 to SSPX3 may emit light of the same color. In an embodiment, the first to third unit pixels SSPX1 to SSPX3 may define a light emitting area that emits light of different colors. For example, the first unit pixel SSPX1 may include light emitting elements LD that emit red light, the second unit pixel SSPX2 may include light emitting elements LD that emit green light, and the third unit pixel SSPX3 may include light emitting elements LD that emit blue light. In an embodiment, all of the first to third unit pixels SSPX1 to SSPX3 may include light emitting elements LD that emit blue light. In this case, in order to form a full-color pixel PXL, a light conversion layer for converting the color of light emitted from the corresponding unit pixel and/or a color filter may be disposed on at least some of the first to third unit pixels SSPX1 to SSPX3.

In an embodiment, the first electrode ETL1 may be an electrode shared by the first to third unit pixels SSPX1 to SSPX3. In this case, the first to third unit pixels may be arranged (e.g., aligned) in the first direction DR1.

The second electrodes ETL21, ETL22, and ETL23 may be spaced apart from the (e.g., from one side of the) first electrode ELT1 in the second direction DR2. The second electrodes ETL21, ETL22, and ETL23 in the first to third unit pixels SSPX1 to SSPX3 may be arranged in the first direction DR1.

The first electrode ELT 1 may be arranged side by side (e.g., in parallel with) the second electrodes ETL21, ETL22, and ETL23 and may be spaced apart from the second electrodes ETL21, ETL22, and ETL23 by an interval (e.g., a predetermined interval).

In an embodiment, the first electrode ETL1 may be a cathode electrode that is electrically coupled to the second power supply VSS. The second electrodes ETL21, ETL22, and ETL23 may be anode electrodes that are electrically coupled to the first power supply VDD. The light emitting elements LD, first and second ends of which are respectively electrically coupled to the first electrode ETL1 and at least one of the second electrodes ETL21, ETL22, and ETL23, are disposed between the first electrode ETL1 and the at least one of the second electrodes ETL21, ETL22, and ETL23. Thus, the first electrode ETL1 and each of the second electrodes ETL21, ETL22, and ETL23 may be electrically coupled to each other.

In an embodiment, one light emitting area for one unit pixel (e.g., SSPX1) may be defined. The light emitting area may be distinguished from the non-light emitting area. For example, a pixel defining layer (or bank or light shielding pattern) for preventing (or reducing) light emitted from the light emitting element LD being transmitted to another area may be disposed in the non-light-emitting area to overlap therewith. Herein, the term "overlap" means that two components overlap each other in the thickness direction (e.g., into the drawing, third direction DR3, perpendicular to the surface of the base layer SUB1) of the display panel, unless otherwise defined.

Figure 14:
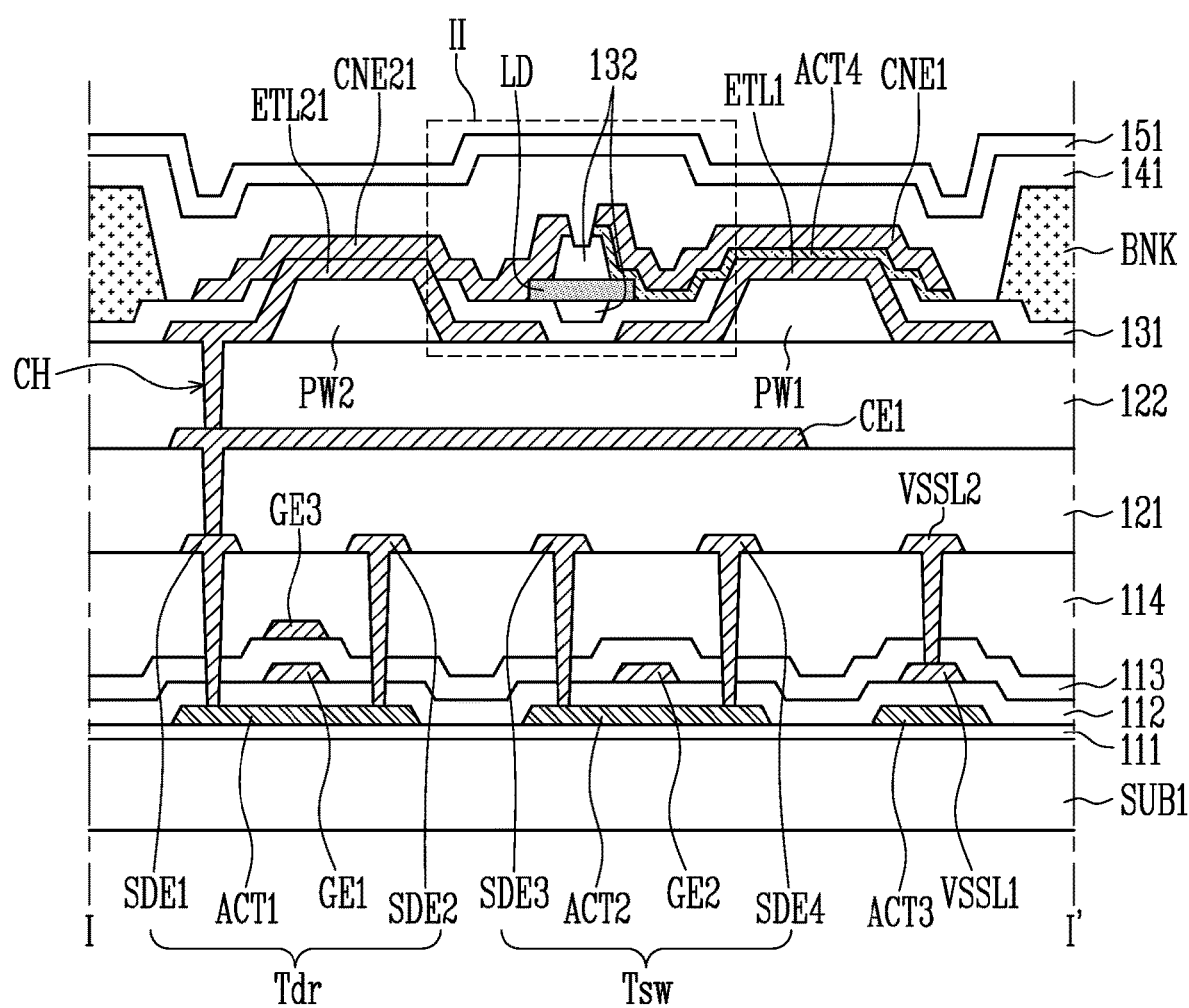
FIG. 14 is a sectional view taken along the line I-I' in FIG. 13.

FIG. 14 is a sectional view of the display panel taken along the line I-I' of FIG. 13.

Referring to FIG. 14, the display panel may include the base layer SUB1 disposed at a lower position. Because the base layer SUB1 has been described above, a duplicate description thereof will be omitted.

A first buffer layer 111 is disposed on the base layer SUB1. The first buffer layer 111 smooths out the surface (e.g., the upper surface) of the base layer SUB1 and prevents or substantially prevents water or external air from penetrating therethrough. The first buffer layer 111 may be an inorganic layer. The first buffer layer 111 may be a single layer or a multi-layer structure.

A plurality of transistors Tdr and Tsw is disposed on the first buffer layer 111. Here, each of the transistors Tdr and Tsw may be a thin film transistor. The two transistors Tdr and Tsw shown in FIG. 14 corresponds to a driving transistor and a switching transistor, respectively.

Each of the transistors Tdr and Tsw may include a semiconductor pattern ACT1, ACT2, a gate electrode GE1, GE2, a source electrode SDE2, SDE4, and a drain electrode SDE1, SDE3. For example, the first transistor Tdr, that is, the driving transistor, may include a first semiconductor pattern ACT1, a first gate electrode GE1, a first source electrode SDE2, and a first drain electrode SDE1. The second transistor Tsw, that is, the switching transistor, may include a second semiconductor pattern ACT2, a second gate electrode GE2, a second source electrode SDE4, and a second drain electrode SDE3.

A first semiconductor layer is disposed on the first buffer layer 111. The first semiconductor layer may include the first semiconductor pattern ACT1 and the second semiconductor pattern ACT2. The first semiconductor layer may further include a third semiconductor pattern ACT3.

The first semiconductor layer may include amorphous silicon, poly silicon, low temperature poly silicon, and an organic semiconductor. In an embodiment, the first semiconductor layer may be an oxide semiconductor. The semiconductor layer may include a channel area and a source area and a drain area, which are disposed on both sides of the channel area and doped with impurities.

A first gate insulating layer 112 is disposed on the first semiconductor layer. The first gate insulating layer 112 may be an inorganic layer. The first gate insulating layer 112 may be a single layer or a multi-layer structure.

A first conductive layer is disposed on the first gate insulating layer 112. The first conductive layer may include the first gate electrode GE1 and the second gate electrode GE2 that are described above. The first conductive layer may further include a first low power pattern VSSL1. The first conductive layer may be formed of a conductive metal material. For example, the first conductive layer may include molybdenum (Mo), aluminum (Al), copper (Cu), and/or titanium (Ti). The first conductive layer may be a single layer or a multi-layer structure.

The first low power pattern VSSL1 may be electrically coupled to the second power supply line. The first low power pattern VSSL1 may be disposed in the display area DA and may overlap the third semiconductor pattern ACT3.

A second gate insulating layer 113 is disposed on the first conductive layer. The second gate insulating layer 113 may be an inorganic layer. The second gate insulating layer 113 may be a single layer or a multi-layer structure.

A second conductive layer is disposed on the second gate insulating layer 113. The second conductive layer may include a third gate electrode GE3. The third gate electrode GE3 may be a gate electrode of another transistor, but the present disclosure is not limited thereto. The second conductive layer may be formed of a conductive metal material. For example, the second conductive layer may include molybdenum (Mo), aluminum (Al), copper (Cu), and/or titanium (Ti). The second conductive layer may be a single layer or a multi-layer structure.

An interlayer insulating layer 114 is disposed on the second conductive layer. The interlayer insulating layer 114 may be an organic layer or an inorganic layer. The interlayer insulating layer 114 may be a single layer or a multi-layer structure.

A third conductive layer is disposed on the interlayer insulating layer 114. The third conductive layer may include source electrodes SDE2 and SDE4 and drain electrodes SDE1 and SDE3 that are described above. The third conductive layer may further include a second low power pattern VSSL2. The third conductive layer may be formed of a conductive metal material. For examples, the source electrodes SDE2 and SDE4, the drain electrodes SDE1 and SDE3, and the second low power pattern VSSL2 may include aluminum (Al), copper (Cu), titanium (Ti), and molybdenum (Mo).

A second low power pattern VSSL2 may be electrically coupled to the second power supply line. The second low power pattern VSSL2 may contact the first low power pattern VSSL1 through contact openings (e.g., contact holes) formed through the second gate insulating layer 113 and the interlayer insulating layer 114. The second low power pattern VSSL2 may be disposed in the display area DA and may overlap the first low power pattern VSSL1 and the third semiconductor pattern ACT3.

The source electrodes SDE2 and SDE4 and the drain electrodes SDE1 and SDE3 are not limited to these terms. In an embodiment, the source electrodes SDE2 and SDE4 illustrated in FIG. 14 may act as drain electrodes, and the drain electrodes SDE1 and SDE3 illustrated in FIG. 14 may act as source electrodes.

The source electrodes SDE2 and SDE4 and the drain electrodes SDE1 and SDE3 may be electrically coupled to the source area and the drain area of each of the corresponding semiconductor patterns ACT1 and ACT2 through contact openings (e.g., contact holes) formed through the interlayer insulating layer 114, the second gate insulating layer 113, and the first gate insulating layer 112.

The display panel may further include a storage capacitor disposed on the base layer SUB1.

A first protective layer 121 is disposed on the third conductive layer. Here, the first protective layer 121 is disposed to cover a circuit including the transistors Tdr and Tsw. The first protective layer 121 may be disposed in at least a portion of the non-display area NDA. The first protective layer 121 may be a passivation layer or a planarization layer. As a passivation layer, the first protective layer 121 may include $SiO_2$, SiNx, and the like, and as a planarization layer, the first protective layer 121 may include a material, such as acryl and polyimide. The first protective layer 121 may include both the passivation layer and the planarization layer. In this case, the passivation layer may be disposed on the third conductive layer and the interlayer insulating layer 114, and the planarization layer may be disposed on the passivation layer. The upper surface of the first protective layer 121 may be planarized.

A fourth conductive layer may be disposed on the first protective layer 121. The fourth conductive layer may include several conductive patterns, such as a power supply line, a signal line, and a connection electrode. In FIG. 14, the fourth conductive layer includes a first connection pattern CE1 disposed in the display area DA. The fourth conductive layer may be formed of a conductive metal material. For example, the fourth conductive layer may include aluminum (Al), copper (Cu), titanium (Ti), and/or molybdenum (Mo).

The first connection pattern CE1 may contact any one of the source electrode SDE2 and the drain electrode SDE1 of the first transistor Tdr through one contact opening (e.g., one contact hole) formed through the first protective layer 121.

A second protective layer 122 is disposed on the fourth conductive layer. The second protective layer 122 may be a passivation layer or a planarization layer. As a passivation layer, the second protective layer 122 may include $SiO_2$, SiNx, and the like, and as a planarization layer, the second protective layer 122 may include a material, such as acryl and polyimide. The second protective layer 122 may include both the passivation layer and the planarization layer.

The second protective layer 122 may include an opening exposing upper portions of some members of the fourth conductive layer. For example, the second protective layer 122 may include an opening exposing at least a portion of the first connection pattern CE1.

Herein, the layers between the base layer SUB1 and the second protective layer 122 are referred to as a pixel circuit layer.

The display panel may include first and second partition walls PW1 and PW2, first and second electrodes ETL1 and ETL21, a first insulating layer 131, light emitting elements LD, a second insulating layer 132, first and second contact electrodes CNE1 and CNE21, a third insulating layer 141, and a thin-film encapsulation layer 151, which are sequentially disposed on the second protective layer 122 in the display area DA.

The first and second partition walls PW1 and PW2 may be disposed on the pixel circuit layer (i.e., on the second protective layer 122). The first and second partition walls PW1 and PW2 may protrude from the pixel circuit layer in the thickness direction (e.g., third direction DR3). In an embodiment, the first and second partition walls PW1 and PW2 may have substantially the same height as each other, but the present disclosure is not limited thereto. For example, the protruding height of each of the first and second partition walls PW1 and PW2 may be in a range from about 1.0 μm to 1.5 μm.

In an embodiment, the first partition wall PW1 may be disposed between the pixel circuit layer and the first electrode ETL1, and the second partition wall PW2 may be disposed between the pixel circuit layer and the second electrodes ETL21, ETL22, and ETL23.

In an embodiment, each of the first and second partition walls PW1 and PW2 may have various shapes. By way of example, as illustrated in FIG. 14, each of the first and second partition walls PW1 and PW2 may have a trapezoidal cross-sectional shape with a decreasing width from a bottom to a top thereof. In this case, each of the first and second partition walls PW1 and PW2 may have an inclined surface on at least one side.

As another example, each of the first and second partition walls PW1 and PW2 may have a semi-circular or semi-elliptical cross-sectional shape with a decreasing width from a bottom to a top thereof. In this case, each of the first and second partition walls PW1 and PW2 may have a curved surface on at least one side. In other words, the shape of each of the first and second partition walls PW1 and PW2 may be changed in various suitable ways rather than being particularly limited. In an embodiment, at least one of the first and second partition walls PW1 and PW2 may be omitted or arranged in a different position.

Each of the first and second partition walls PW1 and PW2 may include insulating material including an inorganic material and/or an organic material. For example, the first and second partition walls PW1 and PW2 may include at least one inorganic layer including various suitable inorganic insulating materials, such as SiNx or SiOx. In another embodiment, the first and second partition walls PW1 and PW2 may include at least one organic layer and/or photoresist layer including various suitable organic insulating materials and may be a single- or multi-layer insulator including organic/inorganic materials in combination. In other words, the materials of the first and second partition walls PW1 and PW2 may be variously, suitably changed.

In an embodiment, each of the first and second partition walls PW1 and PW21 may act as a reflective member (e.g., may be reflective). For example, the first and second partition walls PW1 and PW2, along with the first and second electrodes ETL1 and ETL21 respectively provided on the first and second partition walls PW1 and PW2, may act as reflective members that guide light emitted from each light emitting element LD in a desired direction, thus enhancing the light efficiency of the pixel PXL.

The first and second electrodes ETL1 and ETL21 may be disposed on the first and second partition walls PW1 and PW2, respectively. The first and second electrodes ETL1 and ETL21 may be spaced apart from each other. The first and second electrodes ETL1 and ETL21 may be formed on the same layer.

In an embodiment, the first and second electrodes ETL1 and ETL21 disposed on the upper portions of the first and second partition walls PW1 and PW2, respectively, may have shapes corresponding to the respective shapes of the first and second partition walls PW1 and PW2. For example, the first and second electrodes ETL1 and ETL21 may protrude in the thickness direction of the display panel while having inclined surfaces or curved surfaces corresponding to the first and second partition walls PW1 and PW2, respectively.

Each of the first and second electrodes ELT1 and ELT21 may include at least one conductive material. For example, each of the first and second electrodes ELT1 and ELT21 may include at least one metal, such as Ag, Mg, Al, Pt, Pd, Au, Ni, Nd, Ir, Cr, Ti or an alloy thereof, conductive oxide, such as ITO, IZO, ZnO, or ITZO, and conductive polymer, such as PEDOT; however, the present disclosure is not limited thereto.

Furthermore, each of the first and second electrodes ELT1 and ELT21 may be a single layer or a multi-layer structure. For example, each of the first and second electrodes ELT1 and ELT21 may include at least one reflective electrode layer. Each of the first and second electrodes ETL1 and ETL21 may selectively further include at least one transparent electrode layer disposed on an upper portion and/or a lower portion of the reflective electrode layer and at least one conductive capping layer covering an upper portion of the reflective electrode layer and/or the transparent electrode layer.

In an embodiment, the reflective electrode layer of each of the first and second electrodes ETL1 and ETL21 may include (or may be formed of) an electrode material having uniform or substantially uniform reflectivity. For example, the reflective electrode layer may include at least one metal, such as Ag, Mg, Al, Pt, Pd, Au, Ni, Nd, Ir, Cr, and an alloy thereof; however, the present disclosure is not limited thereto. In other words, reflective electrode layer may be formed of various suitable reflective electrode materials. When each of the first and second electrodes ETL1 and ETL21 includes the reflective electrode layer, light emitted from both ends of each of the light emitting elements LD, that is, the first and second ends thereof, may be further advanced (or directed) in a direction (e.g., the third direction DR3 or front direction) in which an image is displayed. For example, when the first and second electrodes ETL1 and ETL21 are disposed to face the first and second ends of the light emitting elements LD while having inclined surfaces or curved surfaces corresponding to the shape of the first and second partition walls PW1 and PW2, the light emitted from the first and second ends of each of the light emitting elements LD may be reflected by the first and second electrodes ETL1 and ETL21 to be further advanced in the front direction (e.g., the third direction DR3, that is, the upper direction away from the base layer SUB1) of the display panel. Consequently, the light emission (or extraction) efficiency of the light emitting elements LD may be enhanced.

Furthermore, the transparent electrode layer of each of the first and second electrodes ETL1 and ETL21 may be formed of various suitable transparent electrode materials. For example, the transparent electrode layer may include ITO, IZO, or ITZO, but the present disclosure is not limited thereto. In an embodiment, each of the first and second electrodes ELT1 and ELT21 may have a three-layer structure having a stacked structure of ITO/Ag/ITO. As such, when the first and second electrodes ETL1 and ETL21 each are have a multi-layer structure of a plurality of (e.g., two or more) layers, voltage drop due to signal delay (RC delay) may be reduced or minimized. Thus, a desired voltage can be effectively transmitted to the light emitting elements LD.

In addition, when each of the first and second electrodes ETL1 and ETL21 includes the conductive capping layer covering the reflective electrode layer and/or the transparent electrode layer, the reflective electrode layer of the first and second electrodes ETL1 and ETL21 may not be damaged due to defects caused during the manufacturing process of the pixel PXL. However, the conductive capping layer may be selectively included in the first and second electrodes ETL1 and ETL21 (e.g., may be included in only one of the first and second electrodes ETL1 and ETL21) and may be omitted in other embodiments. Furthermore, the conductive capping layer may be considered as part of (e.g., as a component of) each of the first and second electrodes ETL1 and ETL21, or may be considered as a separate component disposed on the first and second electrodes ETL1 and ETL21.

In an embodiment, at least some areas of the second electrodes ETL21, ETL22, and ETL23 may overlap the first connection pattern CE1. The second electrodes ETL21, ETL22, and ETL23 may contact the first connection pattern CE1 through first contact openings (e.g., first contact holes) CH formed through the second protective layer 122.

The first insulating layer 131 may be disposed in one area of (e.g., over) each of the first and second electrodes ETL1 and ETL21 in the display area DA. For example, the first insulating layer 131 may cover one area of each of the first and second electrodes ETL1 and ETL21 and may have an opening exposing another area of each of the first and second electrodes ETL1 and ETL21.

For example, the first insulating layer 131 may be interposed between the first and second electrodes ETL1 and ETL21 and the light emitting elements LD and may expose at least one area of each of the first and second electrodes ETL1 and ETL21. After the first and second electrodes ETL1 and ETL21 are formed, the first insulating layer 131 may be formed to cover the first and second electrodes ETL1 and ETL21 to prevent or substantially prevent the first and second electrodes ETL1 and ETL21 from being damaged or to prevent or substantially prevent metal from being precipitated in a subsequent process. Furthermore, the insulating layer 131 may stably support each light emitting element LD. In an embodiment, the insulating layer 131 may be omitted.

The light emitting elements LD may be supplied and aligned in an area in which the first insulating layer 131 is disposed. For example, the light emitting elements LD may be supplied through an inkjet method or the like, and the light emitting elements LD may be aligned between the first and second electrodes ETL1 and ETL21 by an alignment voltage (or alignment signal) (e.g., a predetermined alignment voltage or signal) applied to the first and second electrodes ETL1 and ETL21.

In an embodiment, the thickness of the first insulating layer 131 may range from about 2500 Å to about 3500 Å.

A bank BNK may be disposed on the first insulating layer 131. For example, the bank BNK may be formed to enclose the sub-pixels (e.g., SPX1 to SPX3 as shown in, for example, FIG. 8), between other sub-pixels, thus forming a pixel defining layer to define the light emitting area.

In some embodiments, the bank BNK may not be disposed between the unit pixels SSPX1 to SSPXk in the same sub-pixels SPX1 to SPX3, but the present disclosure is not limited thereto.

The second insulating layer 132 may be disposed on the light emitting elements LD arranged between the light emitting elements LD, for example, between the first and second electrodes ETL1 and ETL21, and may expose the first ends and the second ends of the light emitting elements LD. For example, the second insulating layer 132 may be partially disposed only on one area of each of the light emitting elements LD without covering the first ends and second ends of the light emitting elements LD. The second insulating layer INS2 may be formed in an independent pattern in each emission area; however, the present disclosure is not limited thereto. Furthermore, as illustrated in FIG. 14, when a space is present between the first insulating layer 131 and each of the light emitting elements LD before the second insulating layer 132 is formed, the space may be filled with the second insulating layer 132. Consequently, the light emitting elements LD may be more stably supported.

In an embodiment, the thickness of the second insulating layer 132 may range from about 7500 Å to about 8500 Å.

The first and second contact electrodes CNE1 and CNE21 may be disposed on the first and second electrodes ETL1 and ETL21 and the first ends and the second ends of the light emitting elements LD, respectively.

In an embodiment, the first and second contact electrodes CNE1 and CNE21 may be disposed in different layers, as illustrated in FIG. 14.

The second contact electrode CNE21 may be disposed on the second electrodes ETL21, ETL22, and ETL23 to contact the second electrodes ETL21, ETL22, and ETL23. For example, the second contact electrode CNE21 may be disposed to contact the second electrode ETL21 on one area of the second electrode ETL21 that is not covered by the first insulating layer 131. Furthermore, the second contact electrode CNE21 may be disposed on the ends of a plurality of light emitting elements LD adjacent to the second electrode ETL21 to contact the ends of the light emitting elements LD. For example, the second contact electrode CNE21 may be disposed to cover the first end or the second end of each of the light emitting elements LD and at least one area of the second electrode ETL21 corresponding thereto. Thereby, the first end or the second end of each of the light emitting elements LD may be electrically coupled to each second electrode ETL21.

A second semiconductor layer may be disposed between the first contact electrode CNE1 and the second insulating layer 132. The second semiconductor layer may be formed after the first contact electrode CNE1 has been formed. The first contact electrode CNE1 may be formed after the second semiconductor layer has been formed.

In an embodiment, each of the first and second contact electrodes CNE1 and CNE21 may include (or may be formed of) a transparent conductive material, such as ITO, IZO, or ITO, to allow light emitted from the light emitting elements LD to be transmitted therethrough.

The second semiconductor layer may include a fourth semiconductor pattern ACT4.

In an embodiment, the fourth semiconductor pattern ACT4 may be directly disposed under the first contact electrode CNE1 and may be in direct contact with the first electrode ETL1. For example, the fourth semiconductor pattern ACT4 may be disposed between the first electrode ETL1 and the first contact electrode CNE1.

The fourth semiconductor pattern ACT4 may be disposed on the first electrode ETL1 to come into contact with the first electrode ETL1. For example, the fourth semiconductor pattern ACT4 may be disposed to contact the first electrode ETL1 on one area of the first electrode ETL1 that is not covered by the first insulating layer 131. Furthermore, the fourth semiconductor pattern ACT4 may be disposed on a first end of at least one light emitting element (e.g., first ends of a plurality of light emitting elements LD) adjacent to the first electrode ETL1 so that the fourth semiconductor pattern ACT4 contacts the first ends of the light emitting elements LD. For example, the fourth semiconductor pattern ACT4 may be disposed to cover the first ends of the light emitting elements LD and at least one area of the first electrode ETL1 corresponding thereto.

For example, the first end of each light emitting element may contact the fourth semiconductor pattern ACT4, and a second end thereof may contact the second contact electrode CNE21.

In an embodiment, the fourth semiconductor pattern ACT4 may overlap the first electrode ETL1 and the first contact electrode CNE1. For example, in a sectional view, the width of the fourth semiconductor pattern ACT4 may be equal to or finely greater than that of the first contact electrode CNE1. The fourth semiconductor pattern ACT4 may overlap with neither (e.g., may be offset from) the second electrode ETL2 nor the second contact electrode CNE21.

The fourth semiconductor pattern ACT4 may include at least one n-type semiconductor material. For instance, the fourth semiconductor pattern ACT4 may include an n-type semiconductor material which includes any one semiconductor material of InAlGaN, GaN, AlGaN, InGaN, AlN, and InN and is doped with a first conductive dopant, such as Si, Ge, or Sn. For example, herein, the fourth semiconductor pattern ACT4 may include n+ Si. However, those skilled in the art will appreciate that the fourth semiconductor pattern ACT4 may include p-type semiconductor material.

When a voltage having a reference level or more (e.g., a predetermined level or more) is applied to the first electrode ETL1, the fourth semiconductor pattern ACT4 may be conductive. For example, when the voltage having the reference level or more is applied to the first electrode ETL1, the first contact electrode CNE1 may electrically connect the first electrode ETL1 with the light emitting element LD. Thereby, the first and second contact electrodes CNE1 and CNE21 may electrically connect the first ends and the second ends of the light emitting elements LD to the first and second electrodes ETL1 and ETL21, respectively.

In an embodiment, the first contact electrode CNE1 may be directly disposed on the fourth semiconductor pattern ACT4.

The third insulating layer 141 may be formed and/or disposed on the first and second partition walls PW1 and PW2, the first and second electrodes ETL1 and ETL21, the light emitting elements LD, the first and second contact electrodes CNE1 and CNE21, the fourth semiconductor pattern ACT4, and the bank BNK to cover the first and second partition walls PW1 and PW2, the first and second electrodes ETL1 and ETL21, the light emitting elements LD, the first and second contact electrodes CNE1 and CNE21, the fourth semiconductor pattern ACT4, and the bank BNK.

In an embodiment, the thickness of the third insulating layer 141 may range from about 2500 Å to about 3500 Å.

In an embodiment, each of the first to third insulating layers 131, 132, and 141 may be a single layer or may have a multi-layer structure and may include at least one inorganic insulating material and/or organic insulating material. For example, each of the first to third insulating layers 131, 132, and 141 may include various suitable organic/inorganic insulating materials including SiNx, but the material of each of the first to third insulating layers 131, 132, and 141 is not particularly limited. The first to third insulating layers 131, 132, and 141 may respectively include different insulating materials, but at least some of the first to third insulating layers 131, 132, and 141 may include the same insulating material.

A thin-film encapsulation layer 151 including at least one inorganic layer and/or organic layer may be provided on the third insulating layer 141. The thin-film encapsulation layer 151 may include another insulating layer. In an embodiment, the thin-film encapsulation layer 151 may be omitted. In an embodiment, the third insulating layer 141 may be omitted, and the thin-film encapsulation layer 151 may be directly disposed on the first and second partition walls PW1 and PW2, the first and second electrodes ETL1 and ETL21, the light emitting elements LD, the first and second contact electrodes CNE1 and CNE21, the fourth semiconductor pattern ACT4, and the bank BNK.

Next, a method of manufacturing a display panel will be described with reference to FIGS. 15 to 23.

FIGS. 15 to 23 are sectional views illustrating a portion of (e.g., steps of) a process of manufacturing a display panel according to an embodiment of the present disclosure. FIGS. 15 to 23 illustrate a process of forming the first insulating layer 131 to the first contact electrode CNE1 during the process of manufacturing the display panel.

Figure 15:
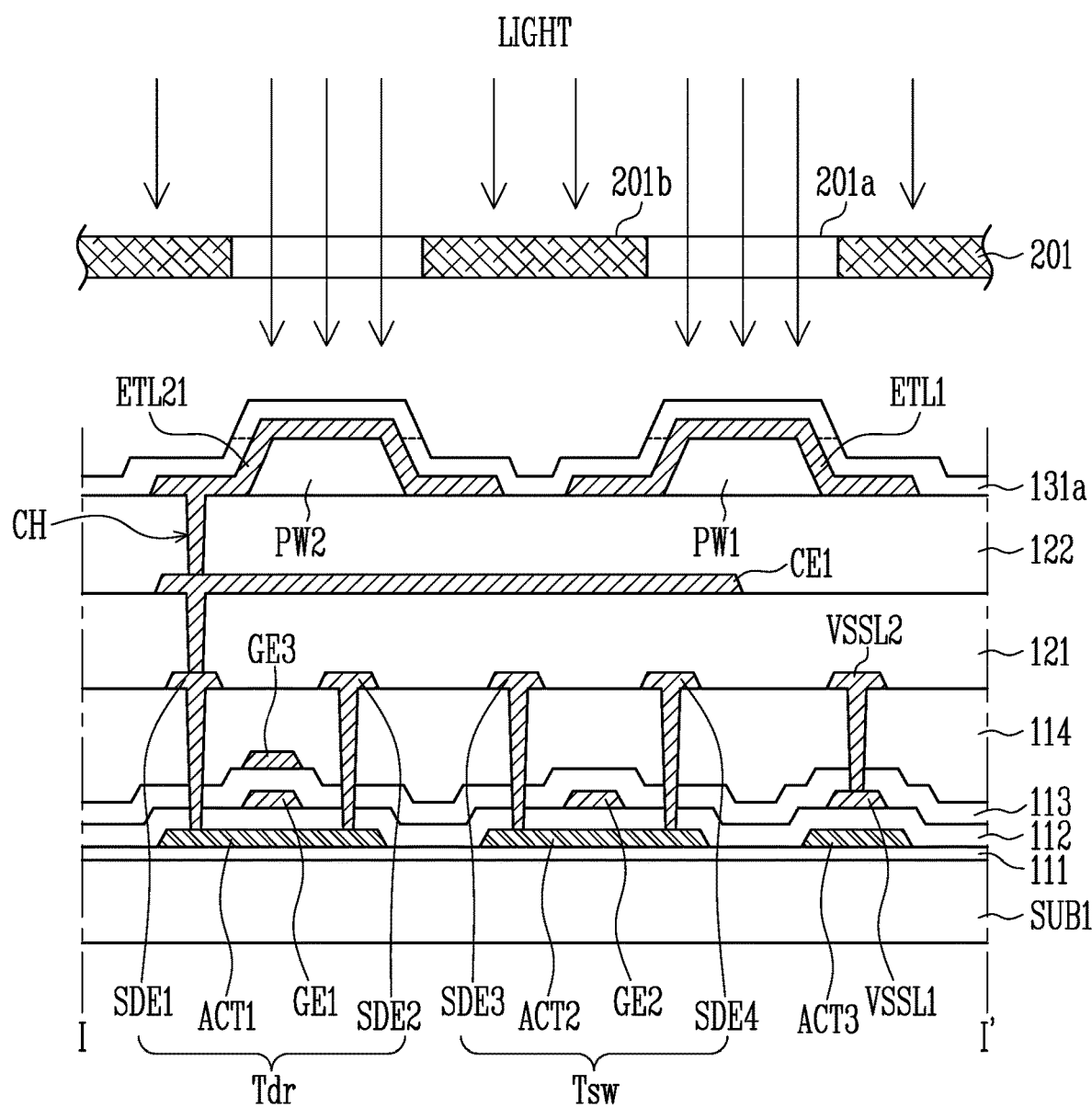
FIGS. 15 to 23 are sectional views illustrating a portion of a process of manufacturing a display panel according to an embodiment of the present disclosure.

An operation illustrated in FIG. 15 may correspond to step S110 of forming the first insulating layer 131.

A first insulating material layer 131a may be disposed over an overall (e.g., an entire) surface of the display panel to cover the partition walls PW1 and PW2 and the first and second electrodes ETL1 and ETL21. Photoresist material may be applied onto the first insulating material layer 131a. The photoresist material may be applied in a scheme, such as a slit coating scheme, a spin coating scheme, and a gravure printing scheme. The photoresist material may be positive-type photoresist material or negative-type photoresist material. Although an embodiment in which the photoresist material includes positive-type photoresist material is illustrated, the present disclosure is not limited thereto. The first insulating material layer 131a may include material included in the first insulating layer 131.

Thereafter, a first mask 201 may be disposed on (or over) the first insulating material layer 131a and the photoresist material. The first mask 201 may include a light transmitting part (e.g., a light transmitting portion) 201a and an opaque part (e.g., an opaque portion) 201b. The opaque part 201b may correspond to an area in which the first insulating layer 131 is to be formed. The light transmitting part 201a may correspond to an area other than the area in which the first insulating layer 131 is to be formed.

Figure 16:
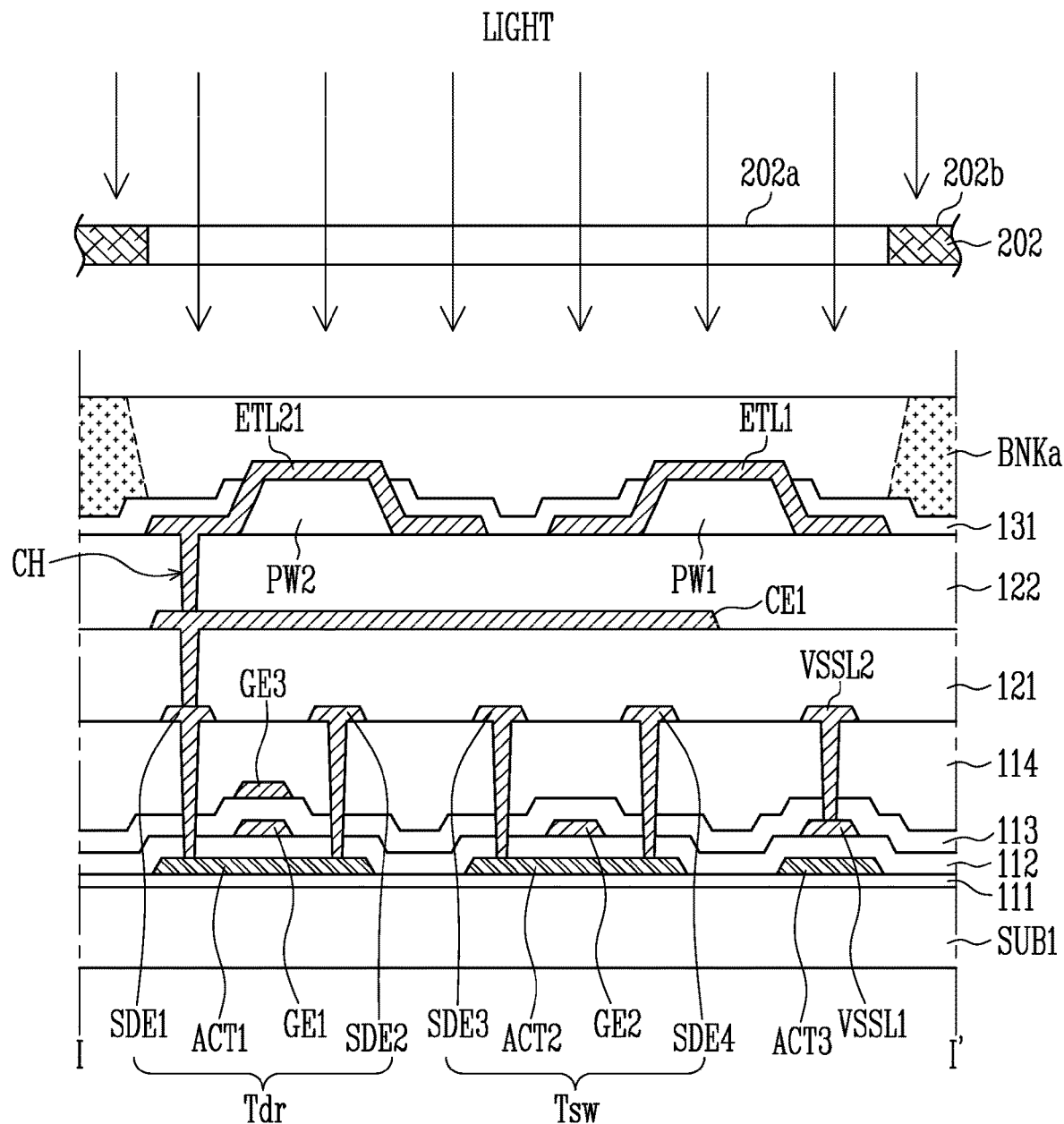

Subsequently, an exposure process, a development process, and/or an etching process may be performed, and the first insulating layer 131 may be completed, as illustrated in FIG. 16.

Next, an operation illustrated in FIG. 16 may correspond to step S120 of forming a bank BNK.

A bank material layer BNKa may be disposed over the overall surface of the display panel to cover the partition walls PW1 and PW2, the first and second electrodes ETL1 and ETL21, and the first insulating layer 131. A photoresist material may be applied onto the bank material layer BNKa. The bank material layer BNKa may include material included in the bank BNK.

Thereafter, a second mask 202 may be disposed on (or over) the bank material layer BNKa and the photoresist material. The second mask 202 may include a light transmitting part (e.g., a light transmitting portion) 202a and an opaque part (e.g., an opaque portion) 202b. The opaque part 202b may correspond to an area in which the bank BNK is to be formed. The light transmitting part 202a may correspond to an area other than the area in which the bank BNK is to be formed.

Figure 17:
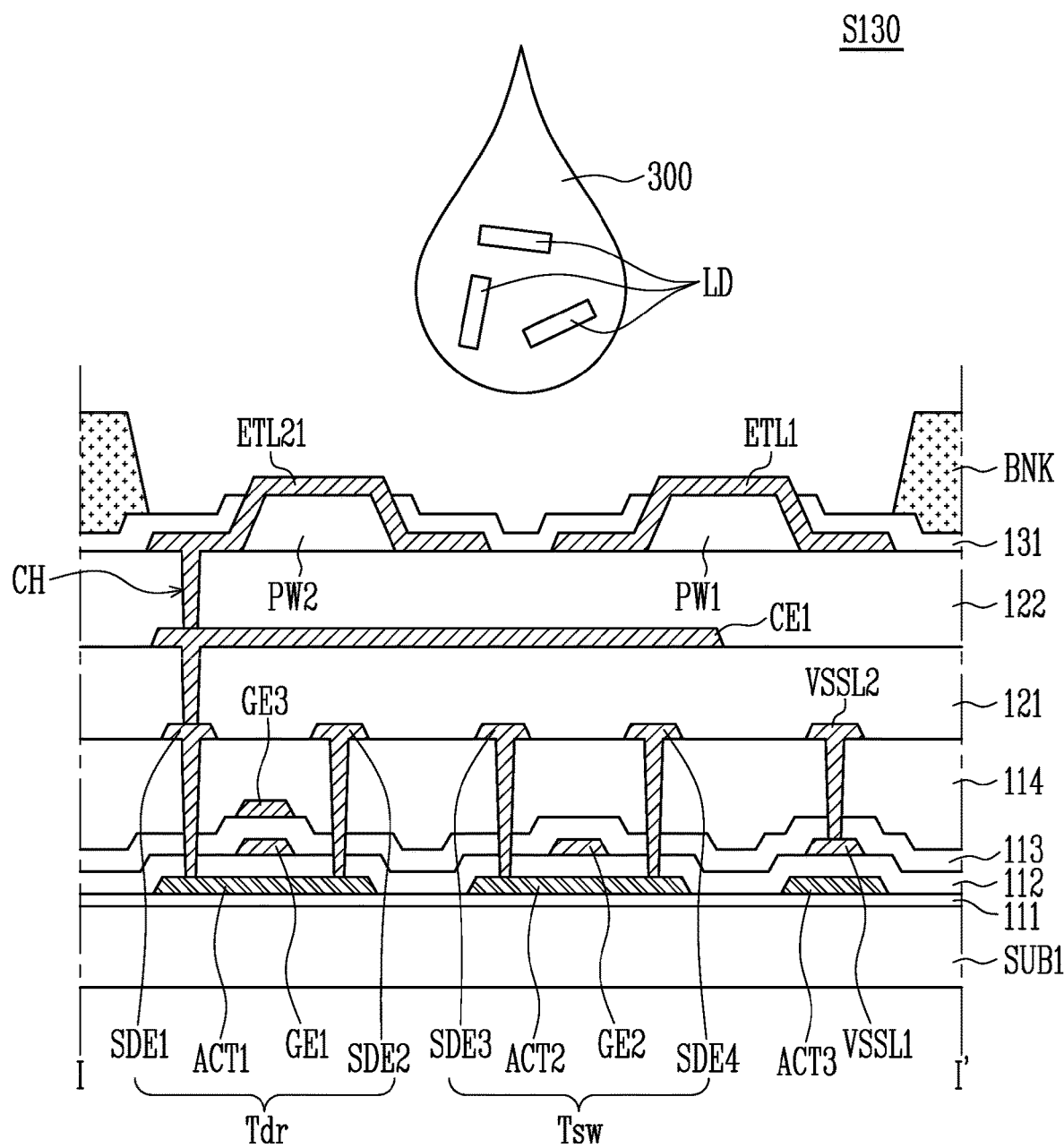

Subsequently, an exposure process, a development process, and/or an etching process may be performed, and the bank BNK may be completed, as illustrated in FIG. 17.

Next, an operation illustrated in FIG. 17 may correspond to step S130 of arranging light emitting elements LD.

A solution including at least one light emitting element LD may be put (e.g., deposited) into an area in which the first and second electrodes ETL1 and ETL21 are formed. An inkjet printing scheme or a fine drop process of about 50 pL or less corresponding thereto may be used as non-limiting examples of a method of putting the light emitting elements LD onto the first and second electrodes ETL1 and ETL21.

For example, a solution 300 including the light emitting elements LD may be put onto the first and second electrodes ETL1 and ETL21 while DC voltage or AC voltage is applied to the first and second electrodes ETL1 and ETL21. The light emitting elements LD may be self-aligned between the first electrode ETL1 and the second electrode ETL21.

For example, the light emitting element LD may be self-aligned by applying the DC or AC voltage to the first and second electrodes ETL1 and ETL21. For example, when a voltage is applied to the first and second electrodes ETL1 and ETL21, an electric field is generated between the first electrode ETL1 and the second electrode ETL21, which induces bipolarity in the light emitting element LD. Thus, as illustrated in FIG. 18, the light emitting elements LD are self-aligned between the first electrode ETL1 and the second electrode ETL21.

Figure 18:
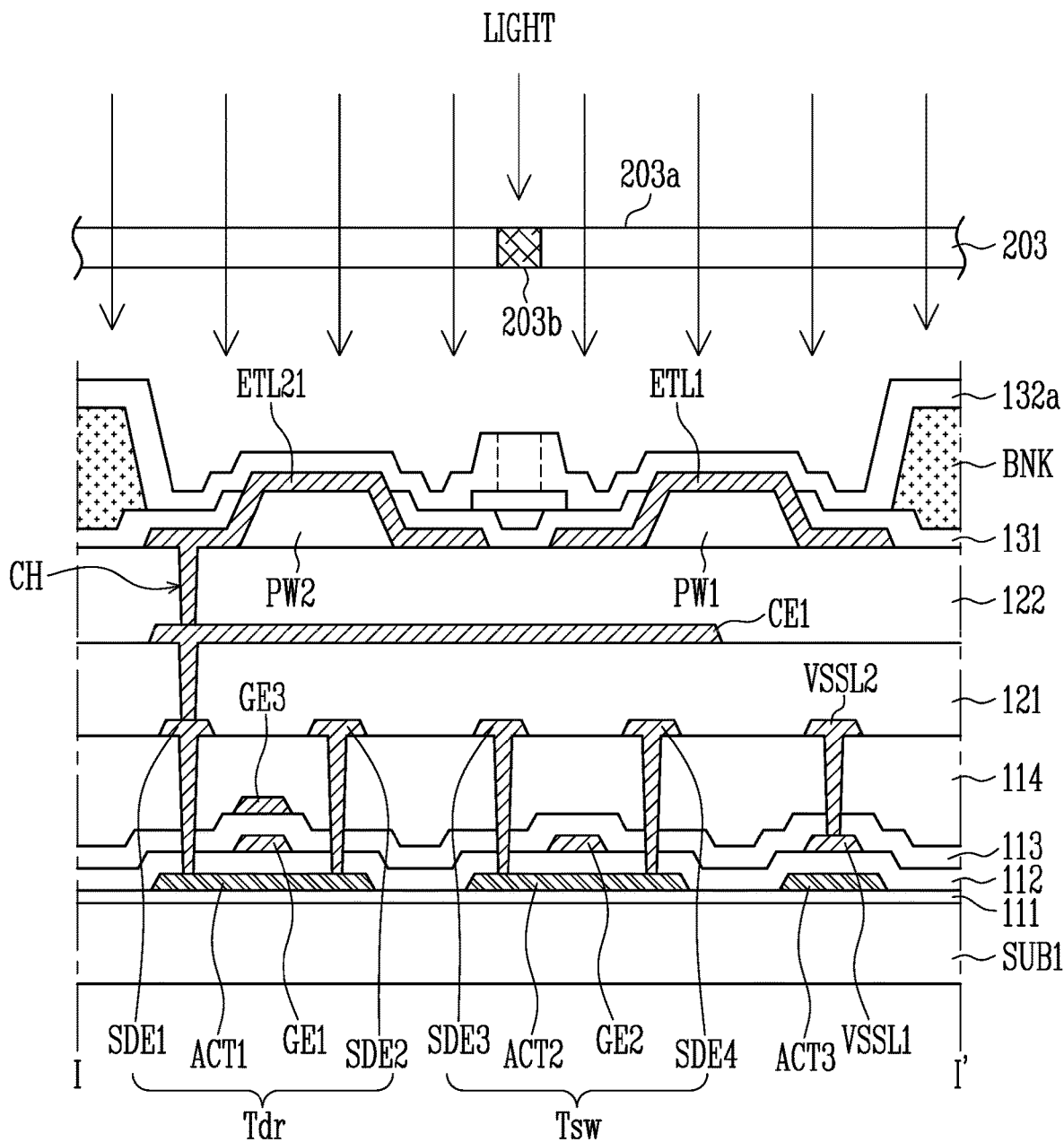

An operation illustrated in FIG. 18 may correspond to step S140 of forming the second insulating layer 132.

A second insulating material layer 132a may be disposed over the overall surface of the display panel to cover the first insulating layer 131, the first and second electrodes ETL1 and ETL21, and the light emitting elements LD. Photoresist material may be applied to the second insulating material layer 132a. The second insulating material layer 132a may include material included in the second insulating layer 132.

Thereafter, a third mask 203 may be disposed on (or over) the second insulating material layer 132a and the photoresist material. The third mask 203 may include a light transmitting part (e.g., a light transmitting portion) 203a and an opaque part (e.g., an opaque portion) 203b. The opaque part 203b may correspond to an area in which the second insulating layer 132 is to be formed. The light transmitting part 203a may correspond to an area other than the area in which the second insulating layer 132 is to be formed.

Figure 19:
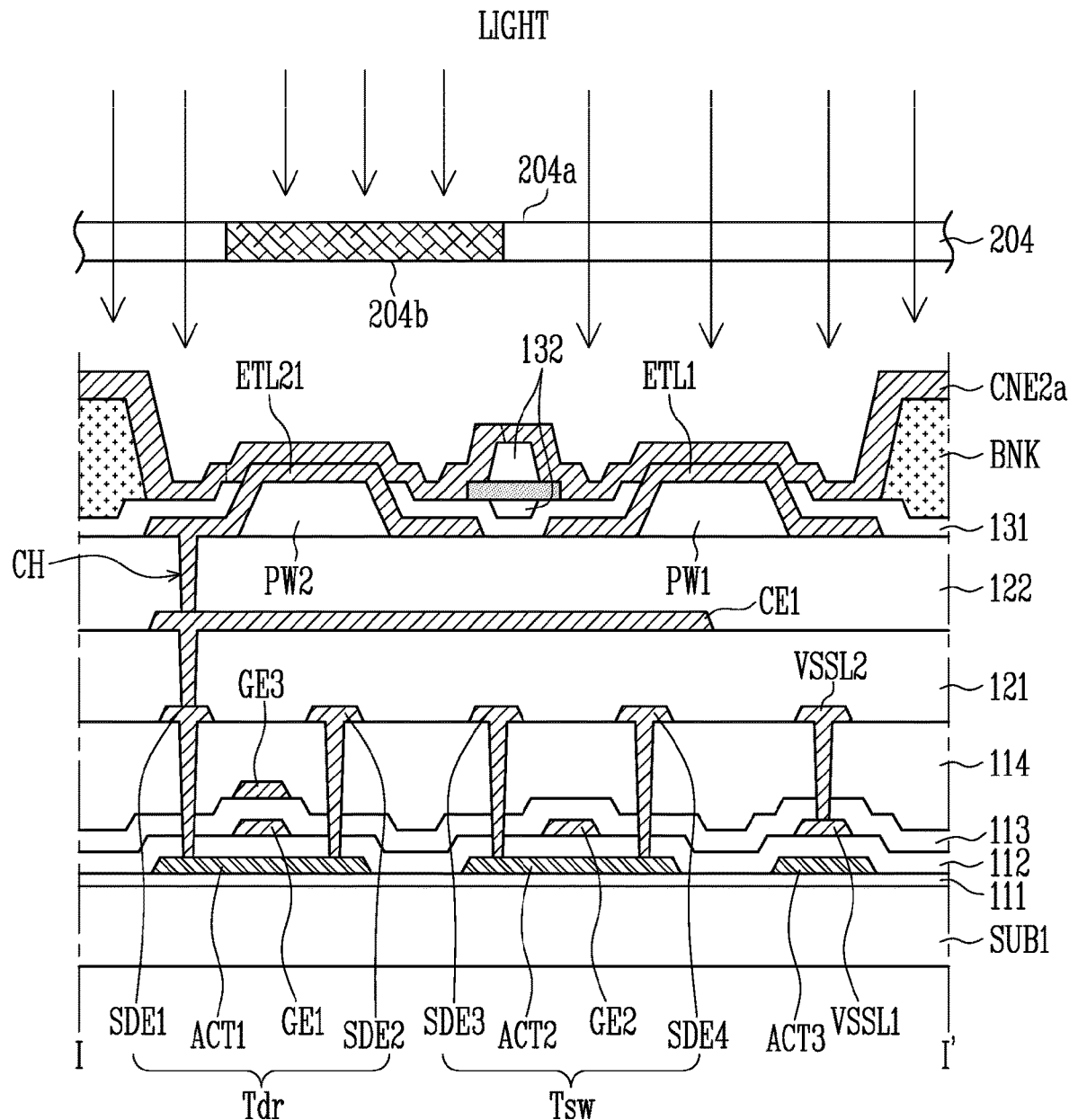

Subsequently, an exposure process, a development process, and/or an etching process may be performed, and the second insulating layer 132 may be completed, as illustrated in FIG. 19.

An operation illustrated in FIG. 19 may correspond to step S150 of forming the second contact electrode CNE21.

A second contact electrode material layer CNE2a may be disposed over the overall surface of the display panel to cover the first insulating layer 131, the first and second electrodes ETL1 and ETL21, the light emitting elements LD, and the second insulating layer 132. Photoresist material may be applied onto the second contact electrode material layer CNE2a. The second contact electrode material layer CNE2a may include material included in the second contact electrode CNE21.

Thereafter, a fourth mask 204 may be disposed on (or over) the second insulating material layer 132a and the photoresist material. The fourth mask 204 may include a light transmitting part (e.g., a light transmitting portion) 204a and an opaque part (e.g., an opaque portion) 204b. The opaque part 204b may correspond to an area in which the second contact electrode CNE21 is to be formed. The light transmitting part 204a may correspond to an area other than the area in which the second contact electrode CNE21 is to be formed.

Figure 20:
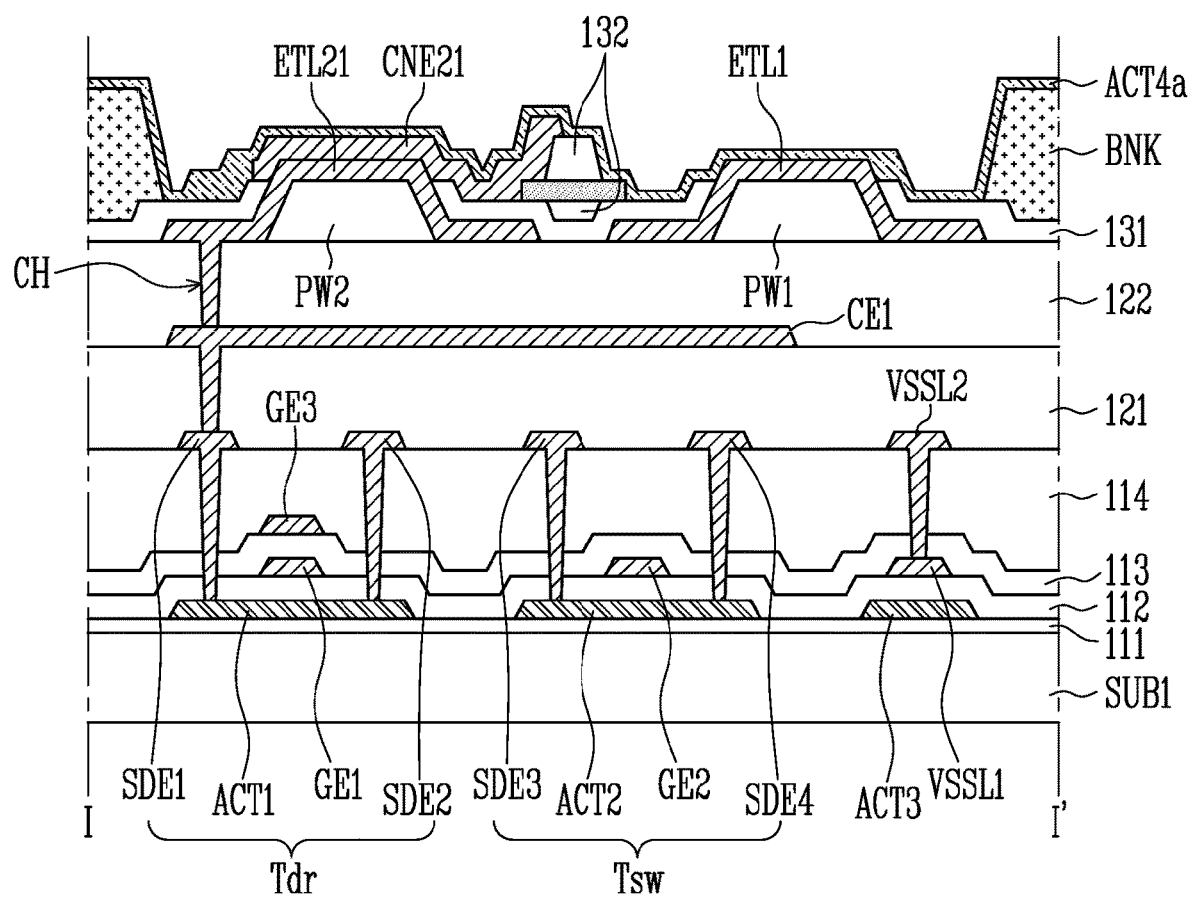

Subsequently, an exposure process, a development process, and/or an etching process may be performed, and the second contact electrode CNE21 may be completed, as illustrated in FIG. 20.

An operation illustrated in FIG. 20 may correspond to step S160 of disposing the second semiconductor layer.

Semiconductor material ACT4a may be disposed over the overall surface of the display panel to cover the first insulating layer 131, the first and second electrodes ETL1 and ETL21, the light emitting elements LD, the second insulating layer 132, and the second contact electrode CNE21. The semiconductor material ACT4a may include material included in the second semiconductor layer (e.g., the fourth semiconductor pattern ACT4).

Figure 21:
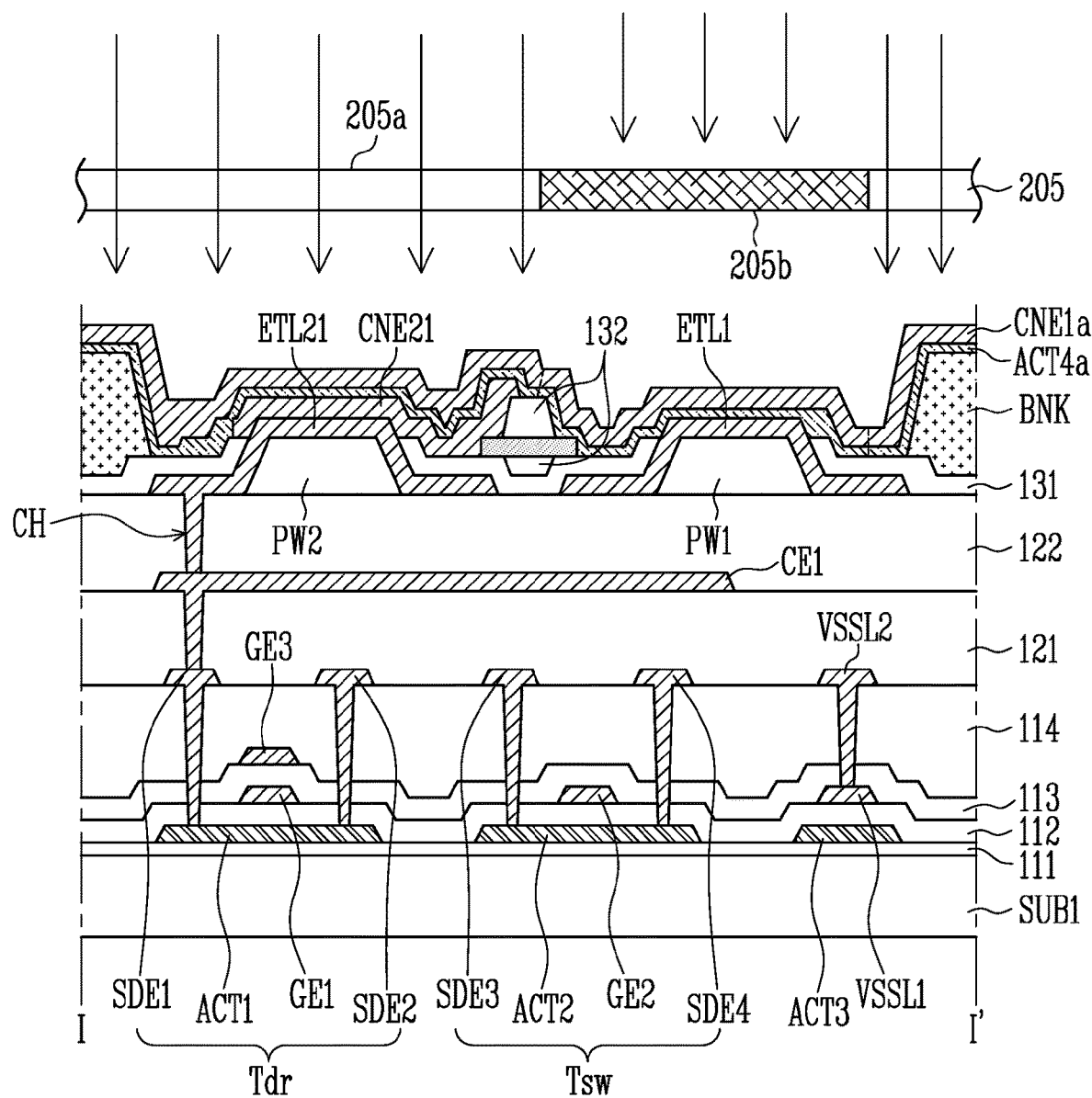

An operation illustrated in FIG. 21 may correspond to step S170 of forming the first contact electrode CNE1. A first contact electrode material layer CNE1a may be disposed over the overall surface of the display panel to cover the semiconductor material ACT4a described with reference to FIG. 20. Photoresist material may be applied onto the first contact electrode material layer CNE1a. The first contact electrode material layer CNE1a may include material included in the first contact electrode CNE1.

Thereafter, a fifth mask 205 may be disposed on the first contact electrode material layer CNE1a and the photoresist material. The fifth mask 205 may include a light transmitting part (e.g., a light transmitting portion) 205a and an opaque part (e.g., an opaque portion) 205b. The opaque part 205b may correspond to an area in which the first contact electrode CNE1 is to be formed. The light transmitting part 205a may correspond to an area other than the area in which the first contact electrode CNE1 is to be formed.

Figure 22:
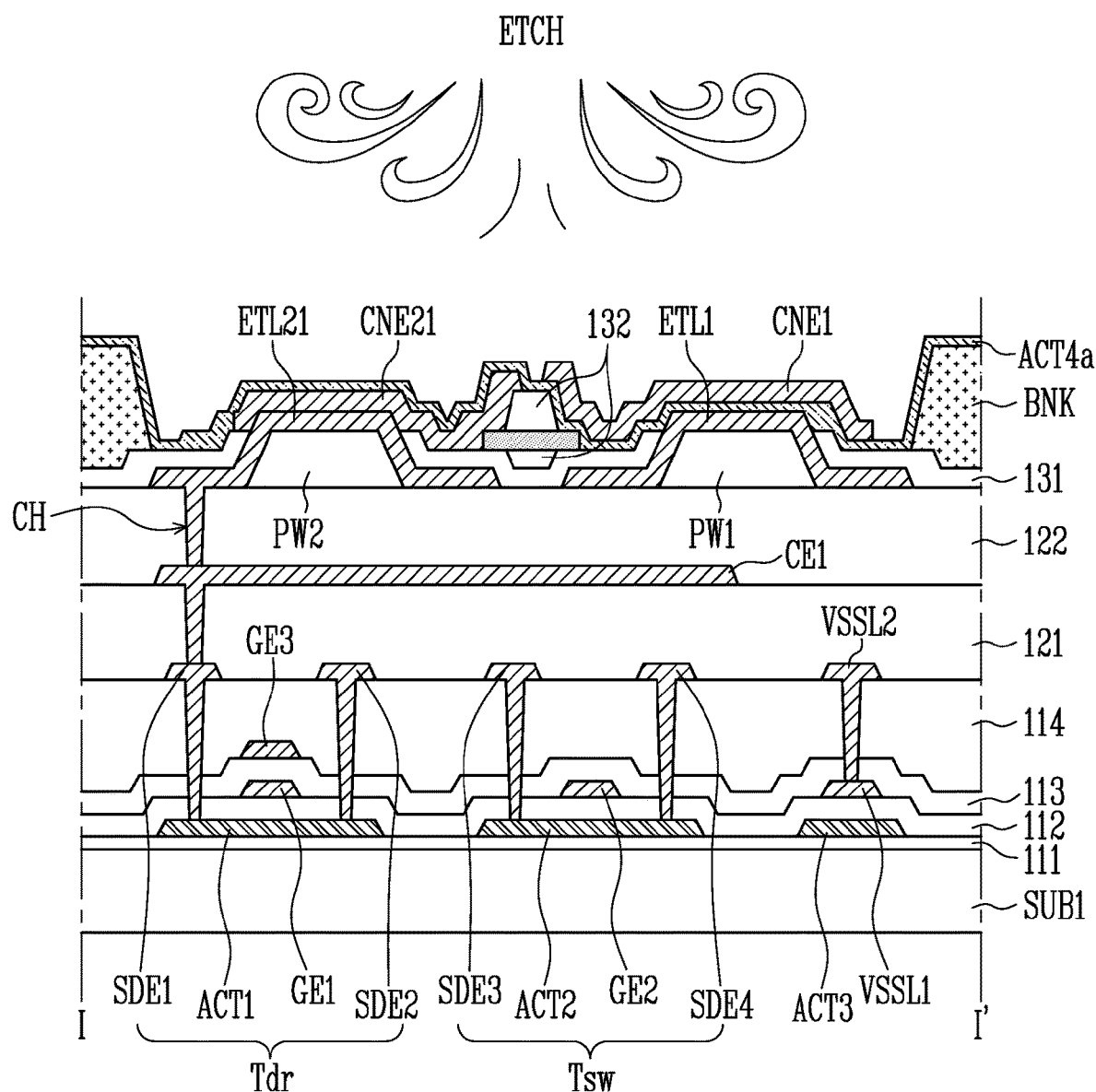

Subsequently, an exposure process, a development process, and/or an etching process may be performed, and the first contact electrode CNE1 may be completed, as illustrated in FIG. 22.

Figure 23:
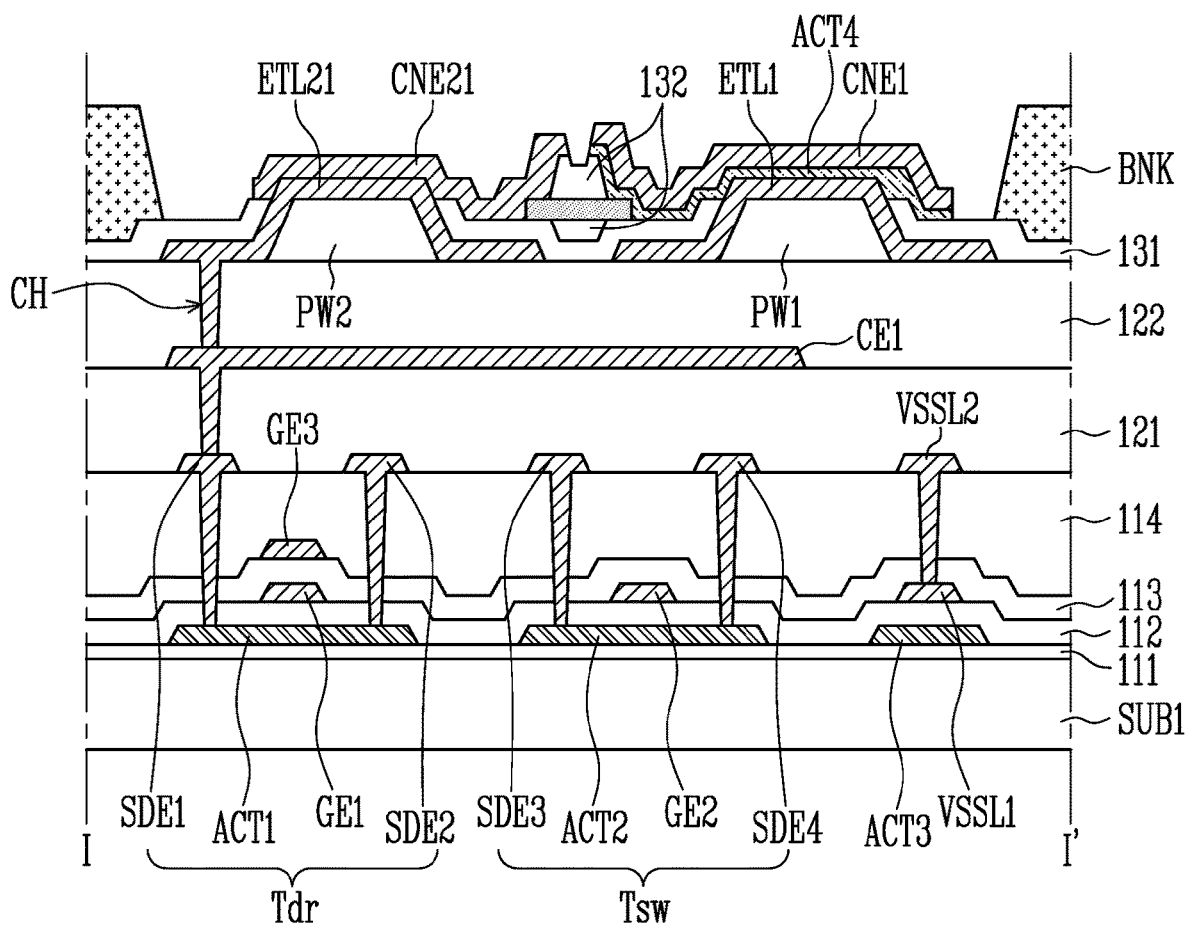

Operations illustrated in FIGS. 22 and 23 may correspond to an etching process step S180 and step S190 of forming the fourth semiconductor pattern ACT4.

After the first contact electrode CNE1 has been formed, at least a portion of the semiconductor material ACT4a described with reference to FIG. 20 may be formed into the fourth semiconductor pattern ACT4 through an etching process. In an embodiment, the etching process may be a dry-etching process. Here, the first contact electrode CNE1 may function as a protective layer during the etching process. Thereby, portions of the semiconductor material ACT4a that are disposed in an area not overlapping the first contact electrode CNE1 may be removed. The portion of the semiconductor material ACT4a that is disposed in an area that overlaps the first contact electrode CNE1 may form the fourth semiconductor pattern ACT4, as illustrated in FIG. 23.

Thereafter, although not illustrated, the third insulating layer 141 and the thin-film encapsulation layer 151 may be sequentially disposed on the second contact electrode CNE21.

As such, the method of manufacturing the display panel may include step S110 of forming the first insulating layer 131, step S120 of forming the bank BNK, step S130 of arranging the light emitting elements LD, step S140 of forming the second insulating layer 132, step S150 of forming the second contact electrode CNE21, step S160 of disposing the second semiconductor layer, step S170 of forming the first contact electrode CNE1, the etching process step S180, and step S190 of forming the fourth semiconductor pattern ACT4.

Herein, an embodiment in which steps are successively performed in a sequence from FIGS. 15 to 23, but without changing the spirit of the present disclosure, some steps illustrated as being successively performed may be substantially simultaneously (or concurrently) performed, the sequence of the steps may be changed, some steps may be skipped (or omitted), or another step may be further included between the steps.

Figure 24:
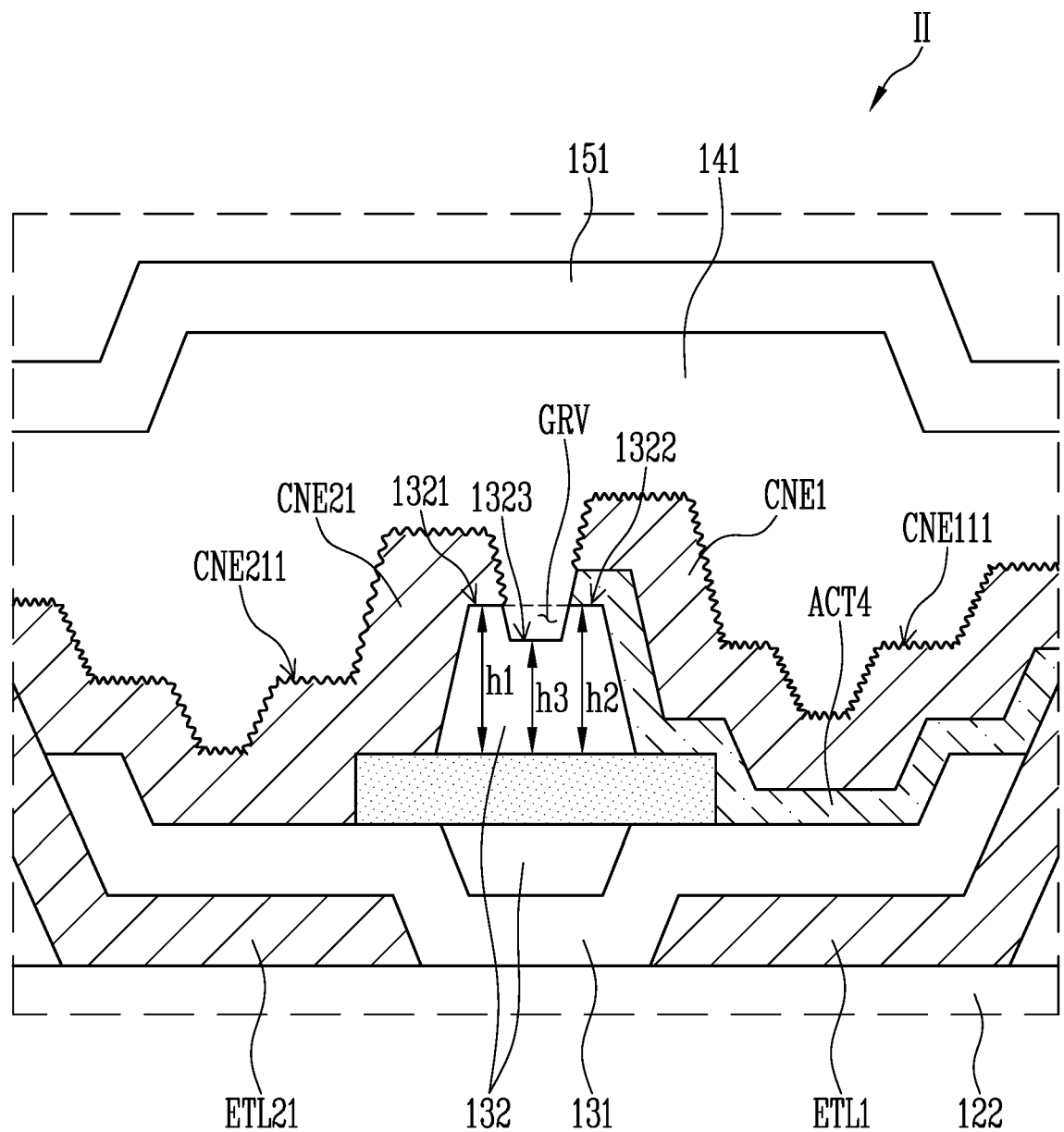
FIG. 24 is an enlarged view of the area II of FIG. 14.

FIG. 24 is an enlarged view of the area II of FIG. 14.

Referring to FIG. 24, respective upper surfaces CNE111 and CNE211 of the first and second contact electrodes CNE1 and CNE21 may be uneven. At the etching process step S180 during the process of manufacturing the display panel, the respective upper surfaces CNE111 and CNE211 of the first and second contact electrodes CNE1 and CNE21 may be partially lost (e.g., partially etched) by an etchant, whereby an uneven surface may be formed.

The second insulating layer 132 may have different heights by areas. A height h1 of an area 1321 in which the second insulating layer 132 overlaps the second contact electrode CNE21 or a height h2 of an area 1322 in which the second insulating layer 132 overlaps the first contact electrode CNE1 may be greater than a height h3 of an area 1323 in which the second insulating layer 132 overlaps neither the first contact electrode CNE1 nor the second contact electrode CNE21. In other words, the second insulating layer 132 may have a groove GRV in an upper surface thereof. The upper surface of the second insulating layer 132 may have a protrusion in each of the areas 1321 and 1322 overlapping the first and second contact electrodes CNE1 and CNE21 and may have a depression in the area 1323 overlapping neither the first contact electrode CNE1 nor with the second contact electrode CNE21. Therefore, the protrusions and the depression may define the groove GRV.

The second insulating layer 132 formed at step S140 of forming the second insulating layer 132 may not include the groove GRV, but during the etching process step S180, the groove GRV may be formed in the area 1323 overlapping neither the first contact electrode CNE1 nor with the second contact electrode CNE21.

In the present embodiment, even though the first contact electrode CNE1 and the second contact electrode CNE21 are formed in different layers, a mask is not used when the fourth semiconductor pattern ACT4 is formed. Therefore, the number of masks required during the manufacturing process may be reduced.

Next, a display device according to an embodiment will be described. Hereinafter, duplicate description of the components identified by the same or similar reference numerals shown in FIGS. 1 to 24 will be omitted.

Figure 25:
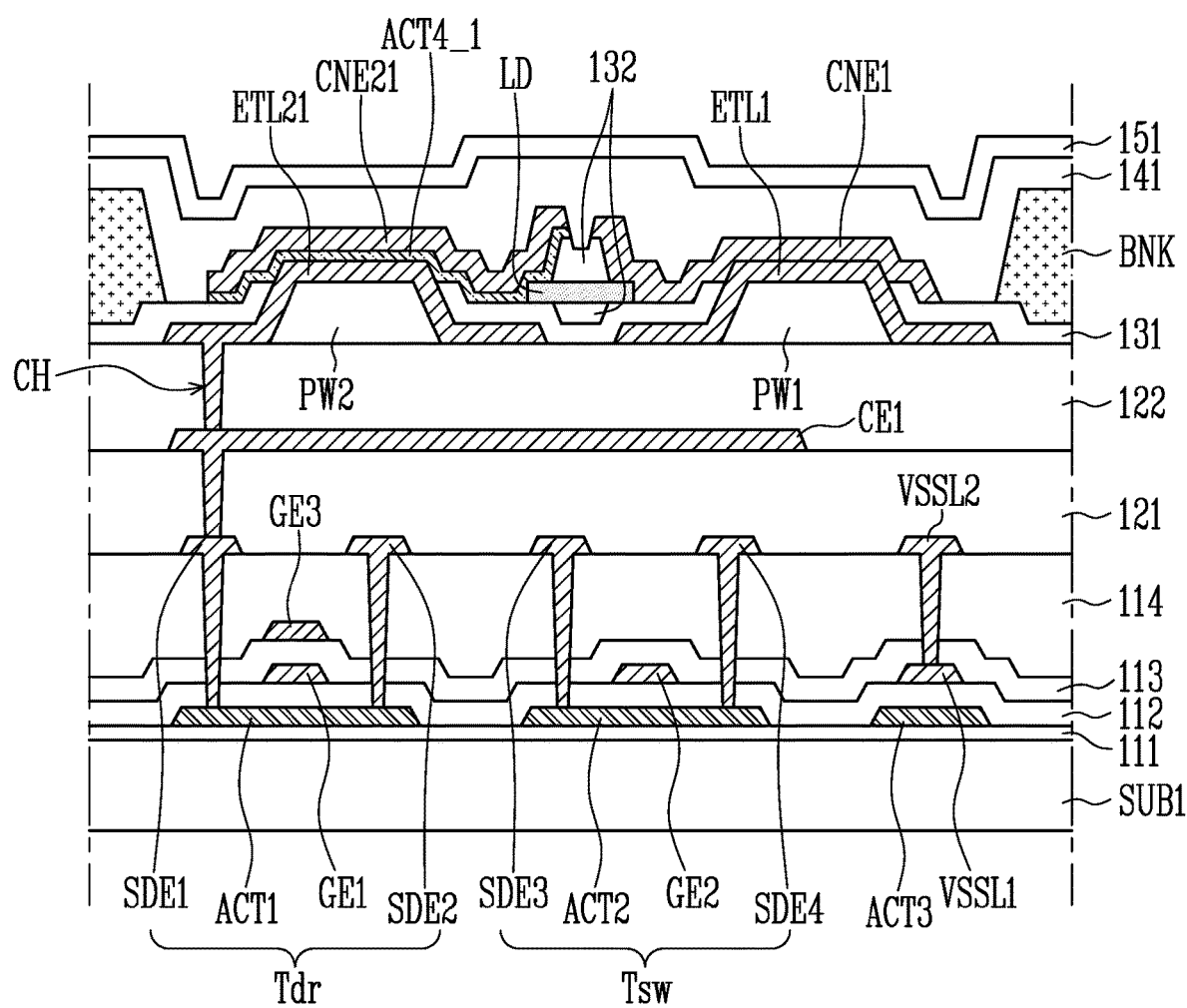
FIG. 25 is a sectional view illustrating a display panel according to an embodiment of the present disclosure.

FIG. 25 is a sectional view illustrating a display panel according to an embodiment of the present disclosure. FIG. 25 is a sectional view corresponding to a portion taken along the line I-I' of FIG. 13.

The embodiment shown in FIG. 25 is different from the other embodiments in that a fourth semiconductor pattern ACT4_1 is disposed between the second electrode ETL21 and the second contact electrode CNE21.

In an embodiment, the fourth semiconductor pattern ACT4_1 may be formed to overlap the second contact electrode CNE21. The fourth semiconductor pattern ACT4_1 may be disposed under the second contact electrode CNE21. The fourth semiconductor pattern ACT4_1 may directly contact the second electrode ETL21 and the second contact electrode CNE21.

The method of manufacturing the display panel may sequentially include the step of forming the first insulating layer 131, the step of forming the bank BNK, the step of arranging the light emitting elements LD, the step of forming the second insulating layer 132, the step of forming the first contact electrode CNE1, the step of disposing the second semiconductor layer, the step of forming the second contact electrode CNE21, the etching process step, and the step of forming the fourth semiconductor pattern ACT4_1.

When a voltage having a reference level (e.g., a predetermined level) or more is applied to the second electrode ETL21, the fourth semiconductor pattern ACT4_1 may be conductive. For example, when the voltage having the reference level or more is applied to the second electrode ETL21, the second contact electrode CNE21 may electrically connect the second electrode ETL21 with the light emitting element LD. Thereby, the first and second contact electrodes CNE1 and CNE21 may electrically connect the first ends and the second ends of the light emitting elements LD to the first and second electrodes ETL1 and ETL21, respectively.

In a method of manufacturing a display device according to an embodiment of the present disclosure, the number of masks may be reduced or minimized.

The aspects and features of the present disclosure are not limited by the foregoing, and other various aspects and features are anticipated herein.

Although the embodiments of the present disclose have been disclosed, those skilled in the art will appreciate that the present disclose can be implemented as other forms, without departing from the scope and spirit of the disclosure as disclosed in the accompanying claims and their equivalents. Therefore, it should be understood that the exemplary embodiments are only for illustrative purpose and do not limit the bounds of the present disclosure.

What is claimed is:

1. A display device comprising:
a substrate;
a pixel circuit layer comprising a plurality of transistors on the substrate;
a first partition wall and a second partition wall on the pixel circuit layer, each of the first and second partition walls having a shape protruding in a thickness direction of the substrate;
a first electrode and a second electrode on the same layer and respectively on the first partition wall and the second partition wall;
a light emitting element between the first electrode and the second electrode, the light emitting element comprising:
a first layer comprising a first-type semiconductor material at a first end of the light emitting element;
a second layer comprising a second-type semiconductor material different from the first-type semiconductor material at a second end of the light emitting element; and
an active layer between the first layer and the second layer;
an insulating layer on the light emitting element;
a semiconductor pattern directly on the first electrode and directly contacting the first end of the light emitting element exposed by the insulating layer;
a first contact electrode on the first partition wall and directly on and entirely covering the semiconductor pattern; and
a second contact electrode directly contacting the second end of the light emitting element exposed by the insulating layer,
wherein the semiconductor pattern and the first electrode are between the first contact electrode and the first partition wall in the thickness direction of the substrate,
wherein the semiconductor pattern comprises one of InAlGaN, GaN, AlGaN, InGaN, AlN, and InN.

2. The display device according to claim 1, wherein the semiconductor pattern does not overlap the second contact electrode in the thickness direction of the substrate.

3. The display device according to claim 1, wherein the first contact electrode and the second contact electrode are on different layers.

4. The display device according to claim 1, wherein the second contact electrode, the semiconductor pattern, and the first contact electrode are on different layers.

5. The display device according to claim 1, wherein the semiconductor pattern is conductive when a voltage having a reference level or more is applied to the first electrode.

6. The display device according to claim 5, wherein, when the voltage having the reference level or more is applied to the first electrode, the first contact electrode electrically connects the first electrode with the light emitting element.

7. The display device according to claim 1, wherein an upper surface of the first contact electrode and an upper surface of the second contact electrode each have an uneven surface.

8. The display device according to claim 1, wherein the insulating layer has an area overlapping the first contact electrode in the thickness direction of the substrate, an area overlapping the second contact electrode in the thickness direction of the substrate, and an area overlapping neither the first contact electrode nor the second contact electrode in the thickness direction of the substrate.

9. The display device according to claim 8, wherein a height of the area overlapping the first contact electrode or a height of the area overlapping the second contact electrode is greater than a height of the area overlapping neither the first contact electrode nor the second contact electrode.

10. The display device according to claim 1, wherein the insulating layer has a groove in an upper surface thereof.

11. The display device according to claim 1, wherein the semiconductor pattern comprises an n-type dopant.

12. The display device according to claim 1, wherein the first-type semiconductor material is an n-type semiconductor material, and
wherein the second-type semiconductor material is a p-type semiconductor material.

* * * * *